United States Patent
Peng et al.

(10) Patent No.: US 9,761,446 B2
(45) Date of Patent: Sep. 12, 2017

(54) METHODS FOR THE SYNTHESIS OF ARRAYS OF THIN CRYSTAL GRAINS OF LAYERED SEMICONDUCTORS SNS2 AND SNS AT DESIGNED LOCATIONS

(71) Applicant: The University of Houston System, Houston, TX (US)

(72) Inventors: Haibing Peng, Houston, TX (US); Guoxiong Su, Houston, TX (US); Debtanu De, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 411 days.

(21) Appl. No.: 14/270,973

(22) Filed: May 6, 2014

(65) Prior Publication Data

US 2014/0332814 A1    Nov. 13, 2014

Related U.S. Application Data

(60) Provisional application No. 61/820,864, filed on May 8, 2013, provisional application No. 61/863,358, filed on Aug. 7, 2013.

(51) Int. Cl.
*H01L 21/205* (2006.01)
*H01L 21/02* (2006.01)
*H01L 23/544* (2006.01)

(52) U.S. Cl.
CPC ...... *H01L 21/0262* (2013.01); *H01L 21/0242* (2013.01); *H01L 21/0259* (2013.01); *H01L 21/02381* (2013.01); *H01L 21/02488* (2013.01); *H01L 21/02521* (2013.01); *H01L 21/02568* (2013.01); *H01L 23/544* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC ......... H01L 21/02568; H01L 21/02485; H01L 21/02499
See application file for complete search history.

(56) References Cited

U.S. PATENT DOCUMENTS

| | | | |
|---|---|---|---|
| 2012/0282489 A1 | 11/2012 | Shin et al. | |
| 2014/0251204 A1* | 9/2014 | Najmaei | C30B 25/04 117/95 |
| 2014/0252316 A1* | 9/2014 | Yan | C09K 11/02 257/24 |

FOREIGN PATENT DOCUMENTS

| | | |
|---|---|---|
| KR | 10-2012-0061224 | 6/2012 |
| KR | 10-2013-0020351 | 2/2013 |

(Continued)

OTHER PUBLICATIONS

Korean Intellectual Property Office; International Search Report and Written Opinion; PCT Application No. PCT/US2014/036968: Sep. 12, 2014.

(Continued)

*Primary Examiner* — Mohsen Ahmadi
*Assistant Examiner* — Scott Stowe
(74) *Attorney, Agent, or Firm* — Jackson Walker LLP; Christopher J. Rourk

(57) ABSTRACT

Methods of producing arrays of thin crystal grains of layered semiconductors, including the creation of stable atomic-layer-thick to micron-thick membranes of crystalline semiconductors by chemical vapor deposition.

20 Claims, 14 Drawing Sheets

(56) References Cited

FOREIGN PATENT DOCUMENTS

| | | |
|---|---|---|
| WO | 2012-148439 | 11/2012 |
| WO | 2012-150761 | 11/2012 |

OTHER PUBLICATIONS

Novoselov, K. S., Geim, A. K., Morozov, S. V., Jiang, D., Zhang, Y., Dubonos, S. V., Grigorieva, I. V. & Firsov, A. A. Electric field effect in atomically thin carbon films. Science 306, 666 (2004).

Novoselov, K. S., Geim, A. K., Morozov, S. V., Jiang, D., Katsnelson, M. I., Grigorieva, I. V., Dubonos, S. V. & Firsov, A. A. Two-dimensional gas of massless Dirac fermions in graphene. Nature 438, 197 (2005).

Zhang, Y. B., Tan, Y. W., Stormer, H. L. & Kim, P. Experimental observation of the quantum Hall effect and Berry's phase in graphene. Nature 438, 201 (2005).

Du, X., Skachko, I., Duerr, F., Luican, A. & Andrei, E. Y. Fractional quantum Hall effect and insulating phase of Dirac electrons in graphene. Nature 462, 192 (2009).

Bolotin, K. I., Sikes, K. J., Jiang, Z., Klima, M., Fudenberg, G., Hone, J., Kim, P. & Stormer, H. L. Ultrahigh electron mobility in suspended graphene. Solid State Communications 146, 351 (2008).

Novoselov, K. S., Jiang, D., Schedin, F., Booth, T. J., Khotkevich, V. V., Morozov, S. V. & Geim, A. K. Two-dimensional atomic crystals. Proceedings of the National Academy of Sciences of the United States of America 102, 10451 (2005).

Coleman, J. N., Lotya, M., O'Neill, A., Bergin, S. D., King, P. J., Khan, U., Young, K., Gaucher, A., De, S., Smith, R. J., Shvets, I. V., Arora, S. K., Stanton, G., Kim, H.-Y., Lee, K., Kim, G. T., Duesberg, G. S., Hallam, T., Boland, J. J., Wang, J. J., Donegan, J. F., Grunlan, J. C., Moriarty, G., Shmeliov, A., Nicholls, R. J., Perkins, J. M., Grieveson, E. M., Theuwissen, K., McComb, D. W., Nellist, P. D. & Nicolosi, V. Two-Dimensional Nanosheets Produced by Liquid Exfoliation of Layered Materials. Science 331, 568 (2011).

Ayari, A., Cobas, E., Ogundadegbe, O. & Fuhrer, M. S. Realization and electrical characterization of ultrathin crystals of layered transition-metal dichalcogenides. Journal of Applied Physics 101, 014507 (2007).

Splendiani, A., Sun, L., Zhang, Y., Li, T., Kim, J., Chim, C.-Y., Galli, G. & Wang, F. Emerging Photoluminescence in Monolayer MoS2. Nano Letters 10, 1271 (2010).

Mak, K. F., Lee, C., Hone, J., Shan, J. & Heinz, T. F. Atomically Thin MoS2: A New Direct-Gap Semiconductor. Physical Review Letters 105, 136805 (2010).

Radisavljevic, B., Radenovic, A., Brivio, J., Giacometti, V. & Kis, A. Single-layer MoS2 transistors. Nature Nanotechnology 6, 147 (2011).

De, D., Manongdo, J., See, S., Zhang, V., Guloy, A. & Peng, H. B. High on/off ratio field effect transistors based on exfoliated crystalline SnS2 nano-membranes. Nanotechnology 24, 025202 (2013).

Diaz-Pinto, C., De, D., Hadjiev, V. G. & Peng, H. AB-Stacked Multilayer Graphene Synthesized via Chemical Vapor Deposition: A Characterization by Hot Carrier Transport. Acs Nano 6, 1142 (2012).

Peng, H. B., Chang, C. W., Aloni, S., Yuzvinsky, T. D. & Zettl, A. Ultrahigh frequency nanotube resonators. Physical Review Letters 97, 087203 (2006).

Peng, H. B., Ristroph, T. G., Schurmann, G. M., King, G. M., Yoon, J., Narayanamurti, V. & Golovchenko, J. A. Patterned growth of single-walled carbon nanotube arrays from a vapor-deposited Fe catalyst. Applied Physics Letters 83, 4238 (2003).

Peng, H. B., Hughes, M. E. & Golovchenko, J. A. Room-temperature single charge sensitivity in carbon nanotube field-effect transistors. Applied Physics Letters 89, 243502 (2006).

Peng, H. B. & Golovchenko, J. A. Coulomb blockade in suspended Si(3)N(4)-coated single-walled carbon nanotubes. Applied Physics Letters 84, 5428 (2004).

Peng, H. B., Chang, C. W., Aloni, S., Yuzvinsky, T. D. & Zettl, A. Microwave electromechanical resonator consisting of clamped carbon nanotubes in an abacus arrangement. Physical Review B 76, 035405 (2007).

Peng, H. B., Zhao, B. R., Xie, Z., Lin, Y., Zhu, B. Y., Hao, Z., Tao, H. J., Xu, B., Wang, C. Y., Chen, H. & Wu, F. Ordered surface structure in La1—xCaxMnO3 films. Physical Review Letters 82, 362 (1999).

Peng, H. B., Zhao, B. R., Xie, Z., Lin, Y., Zhu, B. Y., Hao, Z., Ni, Y. M., Tao, H. J., Dong, X. L. & Xu, B. Surface pattern and large low-field magnetoresistance in La0.5Ca0.5MnO3 films. Applied Physics Letters 74, 1606 (1999).

Peng, H. B., Zhang, X. X., Xie, Z., Tao, H. J., Xu, B., Liu, H. & Zhao, B. R. Exchange biasing and low-field magnetoresistance in La0.67Ca0.33MnO3/La0.5Ca0.5MnO3 bilayers. Physical Review B 61, 8955 (2000).

Diaz-Pinto, C., Lee, S., Hadjiev, V. G. & Peng, H. Probing phonon emission via hot carrier transport in suspended graphitic multilayers. Solid State Communications 151, 1645 (2011).

Diaz-Pinto, C., Wang, X., Lee, S., Hadjiev, V. G., De, D., Chu, W.-K. & Peng, H. Tunable magnetoresistance behavior in suspended graphitic multilayers through ion implantation. Physical Review B 83, 235410 (2011).

De, D., Diaz-Pinto, C., Wu, Z. & Peng, H. B. Negative differential conductance in nano-scale normal metal/ superconductor/normal metal junctions featuring Fe1+yTe1—xSex. Philosophical Magazine 92, 3842 (2012).

Peng, H. B., De, D., Wu, Z. & Diaz-Pinto, C. Observation of multiple superconducting gaps in Fe1+yTe1—xSex via a nanoscale approach to point-contact spectroscopy. Journal of Physics-Condensed Matter 24, 455703 (2012).

Fivaz, R. & Mooser, E. Mobility of Charge Carriers in Semiconducting Layer Structures. Physical Review 163, 743 (1967).

Hase, I. & Nishihara, Y. Electronic band structure of ZrNCl and HfNCl. Physica B 281, 788 (2000).

Hase, I. & Nishihara, Y. Electronic structure of superconducting layered zirconium and hafnium nitride. Physical Review B 60, 1573 (1999).

Williams, R. H., Murray, R. B., Govan, D. W., Thomas, J. M. & Evans, E. L. Band-Structure and Photoemission Studies of Sns2 and Snse2 .1. Experimental. Journal of Physics C-Solid State Physics 6, 3631 (1973).

Yoffe, A. D. Low-dimensional systems: quantum size effects and electronic properties of semiconductor microcrystallites (zero-dimensional systems) and some quasi-two-dimensional systems. Advances in Physics 51, 799 (2002).

Ravindran, P., Delin, A., Ahuja, R., Johansson, B., Auluck, S., Wills, J. M. & Eriksson, O. Optical properties of monoclinic SnI2 from relativistic first-principles theory. Physical Review B 56, 6851 (1997).

Fang, C. M., deGroot, R. A. & Haas, C. Bulk and surface electronic structure of 1T—TiS2 and 1T—TiSe2. Physical Review B 56, 4455 (1997).

Chen, C. H., Fabian, W., Brown, F. C., Woo, K. C., Davies, B., Delong, B. & Thompson, A. H. Angle-Resolved Photoemission-Studies of the Band-Structure of Tise2 and Tis2. Physical Review B 21, 615 (1980).

Seaverson, L. M. & Corbett, J. D. Synthesis and Characterization of Oxide Interstitial Derivatives of Zirconium Monochloride and Monobromide. Inorganic Chemistry 22, 3202 (1983).

Cunningham, G., Lotya, M., Cucinotta, C. S., Sanvito, S., Bergin, S. D., Menzel, R., Shaffer, M. S. P. & Coleman, J. N. Solvent Exfoliation of Transition Metal Dichalcogenides: Dispersibility of Exfoliated Nanosheets Varies Only Weakly between Compounds. Acs Nano 6, 3468 (2012).

Hadjiev, V. G., De, D., Peng, H. B., Manongdo, J. & Guloy, A. M. Phonon probe of local strains in SnSxSe2—x mixed crystals. Physical Review B 87, 104302 (2013).

Chandrasekhar, H. R., Humphreys, R. G., Zwick, U. & Cardona, M. IR and Raman-Spectra of 4-6 Compounds SnS and SnSe. Physical Review B 15, 2177 (1977).

(56) References Cited

OTHER PUBLICATIONS

Vidal, J., Lany, S., d'Avezac, M., Zunger, A., Zakutayev, A., Francis, J. & Tate, J. Band-structure, optical properties, and defect physics of the photovoltaic semiconductor SnS. Applied Physics Letters 100, 032104 (2012).
Butler, S. Z., Hollen, S. M., Cao, L. Y., Cui, Y., Gupta, J. A., Gutierrez, H. R., Heinz, T. F., Hong, S. S., Huang, J. X., Ismach, A. F., Johnston-Halperin, E., Kuno, M., Plashnitsa, V. V., Robinson, R. D., Ruoff, R. S., Salahuddin, S., Shan, J., Shi, L., Spencer, M. G., Terrones, M., Windl, W. & Goldberger, J. E. Progress, Challenges, and Opportunities in Two-Dimensional Materials Beyond Graphene. Acs Nano 7, 2898 (2013).
Wang, Q H., Kalantar-Zadeh, K., Kis, A., Coleman, J. N. & Strano, M. S. Electronics and optoelectronics of two-dimensional transition metal dichalcogenides. Nature Nanotechnology 7, 699 (2012).
Nicolosi, V., Chhowalla, M., Kanatzidis, M. G., Strano, M. S. & Coleman, J. N. Liquid Exfoliation of Layered Materials. Science 340, 1420 (2013).
Xu, M. S., Liang, T., Shi, M. M. & Chen, H. Z. Graphene-Like Two-Dimensional Materials. Chemical Reviews 113, 3766 (2013).
Avouris, P., Chen, Z. H. & Perebeinos, V. Carbon-based electronics. Nature Nanotechnology 2, 605 (2007).
Li, X., Zhang, F. & Niu, Q. Unconventional Quantum Hall Effect and Tunable Spin Hall Effect in Dirac Materials: Applications to an Isolated MoS2 Trilayer. Physical Review Letters 110, 066803 (2013).
Mak, K. F., He, K. L., Shan, J. & Heinz, T. F. Control of valley polarization in monolayer MoS2 by optical helicity. Nature Nanotechnology 7, 494 (2012).
Mitzi, D. B., Kosbar, L. L., Murray, C. E., Copel, M. & Afzali, A. High-mobility ultrathin semiconducting films prepared by spin coating. Nature 428, 299 (2004).
Shi, Y. M., Zhou, W., Lu, A. Y., Fang, W. J., Lee, Y. H., Hsu, A. L., Kim, S. M., Kim, K. K., Yang, H. Y., Li, L. J., Idrobo, J. C. & Kong, J. van der Waals Epitaxy of MoS2 Layers Using Graphene As Growth Templates. Nano Letters 12, 2784 (2012).
Lee, Y. H., Zhang, X. Q., Zhang, W. J., Chang, M. T., Lin, C. T., Chang, K. D., Yu, Y. C., Wang, J. T. W., Chang, C. S., Li, L. J. & Lin, T. W. Synthesis of Large-Area MoS2 Atomic Layers with Chemical Vapor Deposition. Advanced Materials 24, 2320 (2012).
Zhan, Y. J., Liu, Z., Najmaei, S., Ajayan, P. M. & Lou, J. Large-Area Vapor-Phase Growth and Characterization of MoS2 Atomic Layers on a SiO2 Substrate. Small 8, 966 (2012).
Liu, K. K., Zhang, W. J., Lee, Y. H., Lin, Y. C., Chang, M. T., Su, C., Chang, C. S., Li, H., Shi, Y. M., Zhang, H., Lai, C. S. & Li, L. J. Growth of Large-Area and Highly Crystalline MoS2 Thin Layers on Insulating Substrates. Nano Letters 12, 1538 (2012).
Balendhran, S., Ou, J. Z., Bhaskaran, M., Sriram, S., Ippolito, S., Vasic, Z., Kats, E., Bhargava, S., Zhuiykov, S. & Kalantar-zadeh, K. Atomically thin layers of MoS2 via a two step thermal evaporation-exfoliation method. Nanoscale 4, 461 (2012).
Wu, W., De, D., Chang, S. C., Wang, Y. N., Peng, H. B., Bao, J. M. & Pei, S. S. High mobility and high on/off ratio field-effect transistors based on chemical vapor deposited single-crystal MoS2 grains. Applied Physics Letters 102, 142106 (2013).
van der Zande, A. M., Huang, P. Y., Chenet, D. A., Berkelbach, T. C., You, Y. M., Lee, G. H., Heinz, T. F., Reichman, D. R., Muller, D. A. & Hone, J. C. Grains and grain boundaries in highly crystalline monolayer molybdenum disulphide. Nature Materials 12, 554 (2013).
Amani, M., Chin, M. L., Birdwell, A. G., O'Regan, T. P., Najmaei, S., Liu, Z., Ajayan, P. M., Lou, J. & Dubey, M. Electrical performance of monolayer MoS2 field-effect transistors prepared by chemical vapor deposition. Applied Physics Letters 102, 193107 (2013).
Wang, X. S., Feng, H. B., Wu, Y. M. & Jiao, L. Y. Controlled Synthesis of Highly Crystalline MoS2 Flakes by Chemical Vapor Deposition. Journal of the American Chemical Society 135, 5304 (2013).
Price, L. S., Parkin, I. P., Hardy, A. M. E., Clark, R. J. H., Hibbert, T. G. & Molloy, K. C. Atmospheric pressure chemical vapor deposition of tin sulfides (SnS, Sn2S3, and SnS2) on glass. Chemistry of Materials 11, 1792 (1999).
Wang, W., Leung, K. K., Fong, W. K., Wang, S. F., Hui, Y. Y., Lau, S. P., Chen, Z., Shi, L. J., Cao, C. B. & Surya, C. Molecular beam epitaxy growth of high quality p-doped SnS van der Waals epitaxy on a graphene buffer layer. Journal of Applied Physics 111, 093520 (2012).

* cited by examiner

METHODS FOR THE SYNTHESIS OF ARRAYS OF THIN CRYSTAL GRAINS OF LAYERED SEMICONDUCTORS SNS2 AND SNS AT DESIGNED LOCATIONS

RELATED APPLICATIONS

This application claims the benefit of and priority to U.S. Provisional Patent Application Ser. No. 61/820,864, entitled "METHODS FOR THE SYNTHESIS OF ARRAYS OF THIN CRYSTAL GRAINS OF LAYERED SEMICONDUCTORS $SNS_2$ AND SNS AT DESIGNED LOCATIONS," filed May 8, 2013, and U.S. Provisional Patent Application Ser. No. 61/863,358, entitled "METHODS FOR THE SYNTHESIS OF ARRAYS OF THIN CRYSTAL GRAINS OF LAYERED SEMICONDUCTORS $SNS_2$ AND SNS AT DESIGNED LOCATIONS," filed Aug. 7, 2013, the entire content of which are hereby incorporated by reference for all purposes as if set forth herein.

GOVERNMENT LICENSE RIGHTS

This invention was made with government support under Grant No. ECCS-1247874 awarded by the National Science Foundation. The government has certain rights in the invention.

FIELD OF THE INVENTION

The present disclosure relates to methods of producing arrays of thin crystalline grains of layered semiconductors at predefined locations on suitable substrates. More specifically, the key components are: 1) the creation of stable atomic-layer-thick to micron-thick crystalline layered semiconductor grains by chemical vapor deposition (CVD); and 2) the use of predefined nucleation sites to seed the growth of thin semiconductor crystal grains on designed locations in the CVD process.

BACKGROUND

Graphene [1-5] has been under intensive attention since its discovery in 2004 because of its unique chemical and physical properties and its importance in technological applications. More recently, layered semiconductors with finite band gaps [6-11] have emerged as unique platforms for studying fundamental surface chemistry and as promising candidate materials for the next-generation nano-electronics, which are complementary to graphene-based materials with zero or very small band gap. Of particular interest are metal dichalcogenides and halides stable in the form of nano-membranes with a thickness down to single or a few atomic/molecular layers, which not only provide unique platforms for studying fundamental sciences, but also possess significant potentials for a wide scope of applications such as transistors, memory devices and energy storage. For example, significant attention has been directed to molybdenum disulfide ($MoS_2$) [8-10], a metal dichalcogenide with an indirect band gap of 1.29 eV in the bulk form but, interestingly, undergoing a transition toward a direct band gap of 1.9 eV in the form of a single atomic-layer.[9,10]

Recently, it has been shown that exfoliated crystalline nano-membranes of $SnS_2$, another layered semiconductor with a band gap of 2.1 eV, show great potential as the building blocks for nano-electronics.[12] Bulk $SnS_2$ is a layered material (FIG. 1) with a hexagonal $CdI_2$ type crystal structure. The crystals consist of stacked S—Sn—S trilayers which are bonded by strong covalent forces within each trilayer but only weakly coupled to adjacent trilayers via van der Waals interactions. As a consequence of the weak inter-layer force, it is possible to realize stable thin nano-membranes of such materials with a thickness down to single or a few atomic/molecular layers.

However, despite its technological importance, the synthesis of thin crystal arrays of such 2D semiconductors at designed locations on suitable substrates has not been realized. The creation of such single and few atomic layers (membranes) is usually achieved by using mechanical and chemical exfoliation techniques to separate bulk crystals into multi-layers (FIG. 1). For example, a widely adopted technique is to use an adhesive Scotch tape for mechanical exfoliation, with little control on the yield and the thickness of the resultant membranes. Subsequently, by complicated solution-based processing, such exfoliated membranes are transferred on to a suitable substrate (e.g. $SiO_2/Si$) for the purpose of characterization and device fabrication, which further limits the usefulness of the exfoliation approach in technological applications of such semiconductor membranes. In particular, most practical applications require the controlled placement of arrays of such thin semiconductor crystals on the designed locations on suitable substrates. To our knowledge, there has been no report of the direct synthesis of such crystalline thin semiconductor arrays on desired locations on suitable substrates, which is critical for many practical applications. The present disclosure provides a novel approach to the controlled synthesis of thin crystal arrays of SnS2 and SnS at predefined locations on chip, by integrating a top-down process—standard nanofabrication, and a bottom-up process—chemical vapor deposition. This integrated process provides single- or a-few-atomic/molecular-layer thick or micron-thick thin crystal grains of layered semiconductors directly on suitable substrates at predefined locations, which is suitable for wafer-scale production and compatible with the strategy for integrated circuits in semiconductor industry. The present disclosure provides novel chemical routes to atomic-layer-thick semiconductor crystal grains, and lays down the foundation for the future integration of such low-dimensional nano-materials in industrial applications. This opens a pathway for the large-scale production of layered 2D semiconductor devices and lays down the foundation for their future applications in integrated nano-electronic/photonic systems.

SUMMARY

The present disclosure comprises a chemical vapor deposition (CVD) method to achieve the controllable synthesis of thin crystal arrays (with a thickness from single-or a few atomic/molecular layers to even micrometers) of layered semiconductors (including, but not limited to, metal chalcogenides such as $SnS_2$, SnS, $SnSe_2$, SnSe, $TiS_2$, $TiSe_2$, $MoS_2$, $MoSe_2$, $WSe_2$ and $WS_2$; the above metal chalcogenides with mixed chalcogens such as $SnS_{2-x}Se_x$ and $SnS_{1-x}Se_x$; and metal halides such as ZrNCl and ZrNBr) directly on suitable substrates at predefined locations.

BRIEF DESCRIPTION OF THE DRAWINGS

The following drawings form part of the present specification and are included to further demonstrate certain aspects of the present disclosure. The present disclosure may be better understood by reference to one or more of these drawings in combination with the detailed description of specific embodiments presented herein.

FIG. 8 shows a method for creating arrays of thin $SnS_2$ and SnS crystal grains at predefined locations on substrates in an embodiment of the present disclosure. (a) Schematic diagram of experimental procedures to pattern catalyst arrays and use these catalyst sites to seed the growth of $SnS_2$ crystals by CVD. (b) Illustration of the CVD set up. (c) An example recipe for CVD growth of the $SnS_2$ crystal arrays of FIG. 8a.

DETAILED DESCRIPTION

Figure 1:
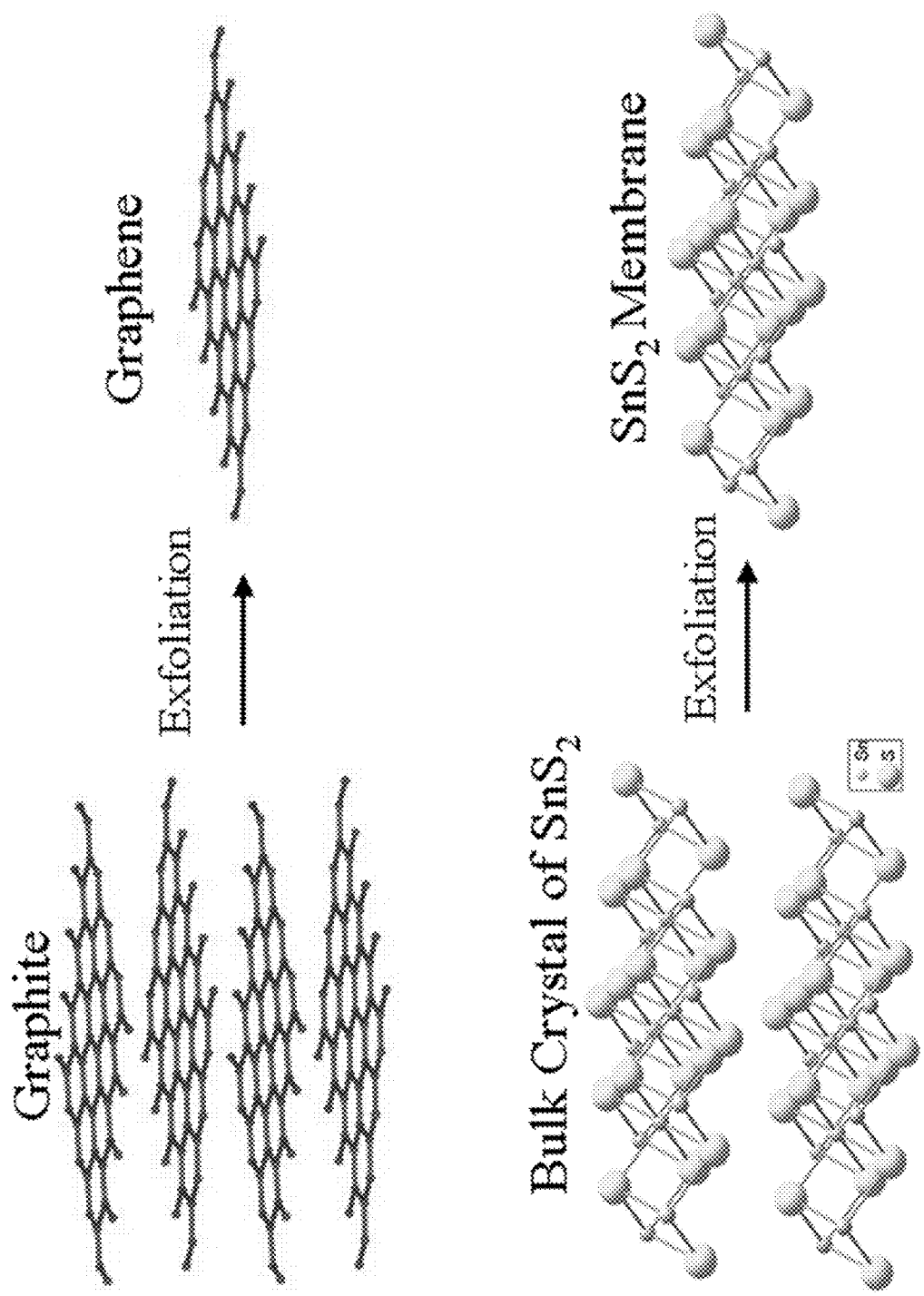
FIG. 1 shows a mechanical exfoliation method for producing graphene and atomic-layer-thick membranes of metal dichalcogenides.

The present disclosure relates to methods of producing arrays of thin crystalline grains of layered semiconductors at predefined locations on suitable substrates. More specifically, two key components are: 1) the creation of stable atomic-layer-thick to micron-thick crystalline layered semiconductor grains by chemical vapor deposition (CVD); and 2) the use of predefined nucleation sites to seed the growth of thin semiconductor crystal grains on designed locations in the CVD process, which is critical for practical applications.

In one embodiment, the present disclosure comprises a method of producing a semiconductor crystal grain (e.g., $SnS_2$ and SnS) on a substrate, comprising the steps of: a) producing a defect or catalytic site on the substrate; and b) heating a first solid material (or compound) source and a second solid material (or compound) source in the presence of the substrate. The first solid material source and the second solid material source can be heated sufficiently to form a vapor, and the vapors of the first material source and the second material source can be deposited on the substrate at the defect or catalytic site to form a semiconductor crystal grain.

The semiconductor crystal grains of the present disclosure are formed at a predetermined location, selected by the location of a defect or catalytic site. In some embodiments of the present disclosure, defect or catalytic sites are produced by photolithography; e-beam lithography; a stencil mask, by electron or ion beam exposure, by etching, by creating an alignment mark made of Pd/Cr, Ni, Cr, Pd, or a combination thereof, or by creating an alignment mark made of an insulator (such as $SiO_2$, $Al_2O_3$, $HfO_2$), or by any other conventional method known in the art.

In some embodiments of the present disclosure, multiple defect or catalytic sites are produced on the substrate such that the semiconductor crystal grains deposited using CVD form an array, or a thin continuous film.

The semiconductor crystal grain of the present disclosure may be a metal chalcogenide or metal halide, and may be $SnS_2$, SnS, $MoS_2$, $WS_2$, $SnSe_2$, SnSe, $SnSe_xS_{2-x}$, $SnS_{1-x}Se_x$, $SnI_2$, $TiS_2$, $PbI_2$, ZrNCl, ZrNBr, ZrCl, ZrBr, or any other conventional material with similar features known in the art.

In some embodiments of the present disclosure, the first solid material source is Sn, and the Sn is heated to between 200° C. and 1100° C. The second solid material source is S, and the S is heated to about 115° C. or higher to produce $SnS_2$ crystal grains or continuous films.

In some embodiments of the present disclosure, the first solid material source is Sn, and the Sn is heated to between about 200° C. and 1100° C. The second solid material source is S, and the S is heated to about 115° C. or lower, for example 100° C., to produce SnS crystal grains or continuous films.

In certain embodiments of the present disclosure, the substrate is $SiO_2$/Si or the like.

The present disclosure provides a method of using CVD to grow arrays of thin semiconductor crystal grains at predefined locations. In some embodiments of the present disclosure, the semiconductor crystal grains are $SnS_2$ or SnS. Arrays of thin semiconductor crystal grains are useful in device applications such as field-effect transistors, sensors, memory devices, optoelectronic devices (e.g., photo detectors), and energy storage.

The present disclosure provides a significant advantage over previous attempts to form continuous thin films of polycrystalline layered semiconductors or randomly (uncontrollably) positioned crystal grains, in that the crystal grains are localized to a predetermined location, and in that the semiconductor crystal grains form a natural crystal shape (e.g., hexagonal shape for $SnS_2$ or rhombic shape for SnS). The hexagonal shaped $SnS_2$ crystals or rhombic shaped SnS crystals could not be produced by exfoliation techniques.

Creation of Stable Atomic-Layer-Thick to Micron-Thick Crystal Grains of Layered Semiconductors by Chemical Vapor Deposition In one embodiment of the present disclosure, chemical vapor deposition is used to synthesize atomic-layer-thick to micron-thick crystal grains of layered semiconductors directly on insulating substrates such as $SiO_2$/Si, $Al_2O_3$, quartz, or any other conventional insulating substrate. In certain embodiments, layered semiconductors such as the transition-metal dichalcogenide $SnS_2$ are used, which consist of angstrom-thick atomic tri-layers bonded by strong covalent forces within each tri-layer, yet stacked via weak van der Waals forces between adjacent tri-layers (FIG. 1).

The chemical vapor deposition of $SnS_2$ and SnS crystal grains (and continuous thin films) was evaluated in the present application, and similar strategies are applied to other materials (e.g. $SnSe_2$, $SnSe_xS_{2-x}$, SnSe, $SnSe_xS_{1-x}$, $SnI_2$, $TiS_2$, $MoS_2$, $WS_2$, $PbI_2$, ZrNCl, ZrNBr, ZrCl and ZrBr). $SnS_2$ has been demonstrated [12] as a particularly important candidate of the next-generation field-effect-transistor to replace Si-based nano-electronics. However, prior to the present disclosure, no methods of producing semiconducting thin $SnS_2$ crystal grains suitable for large-scale device applications (e.g. integrated circuits) have been available.

Figure 2:
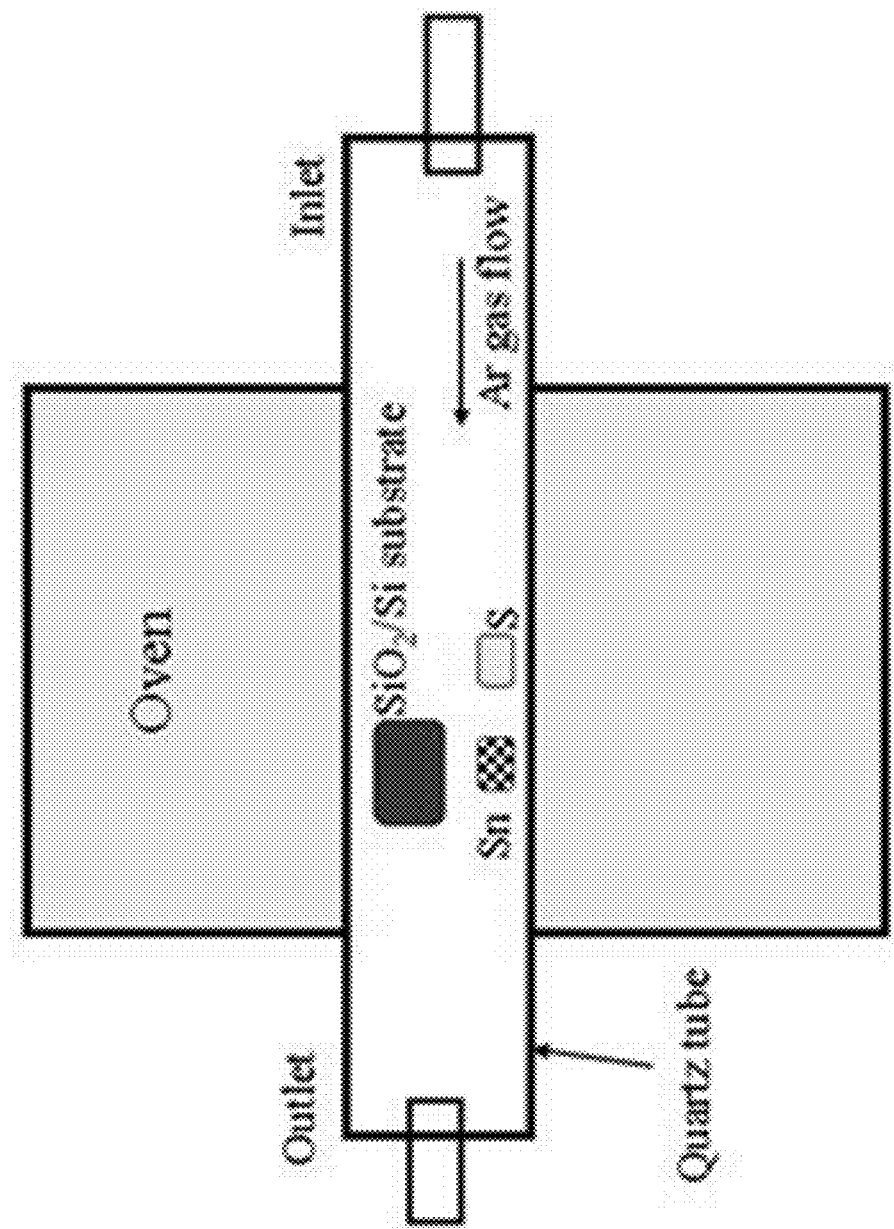
FIG. 2 shows a schematic diagram for a first CVD approach according to the present disclosure.
Figure 3:
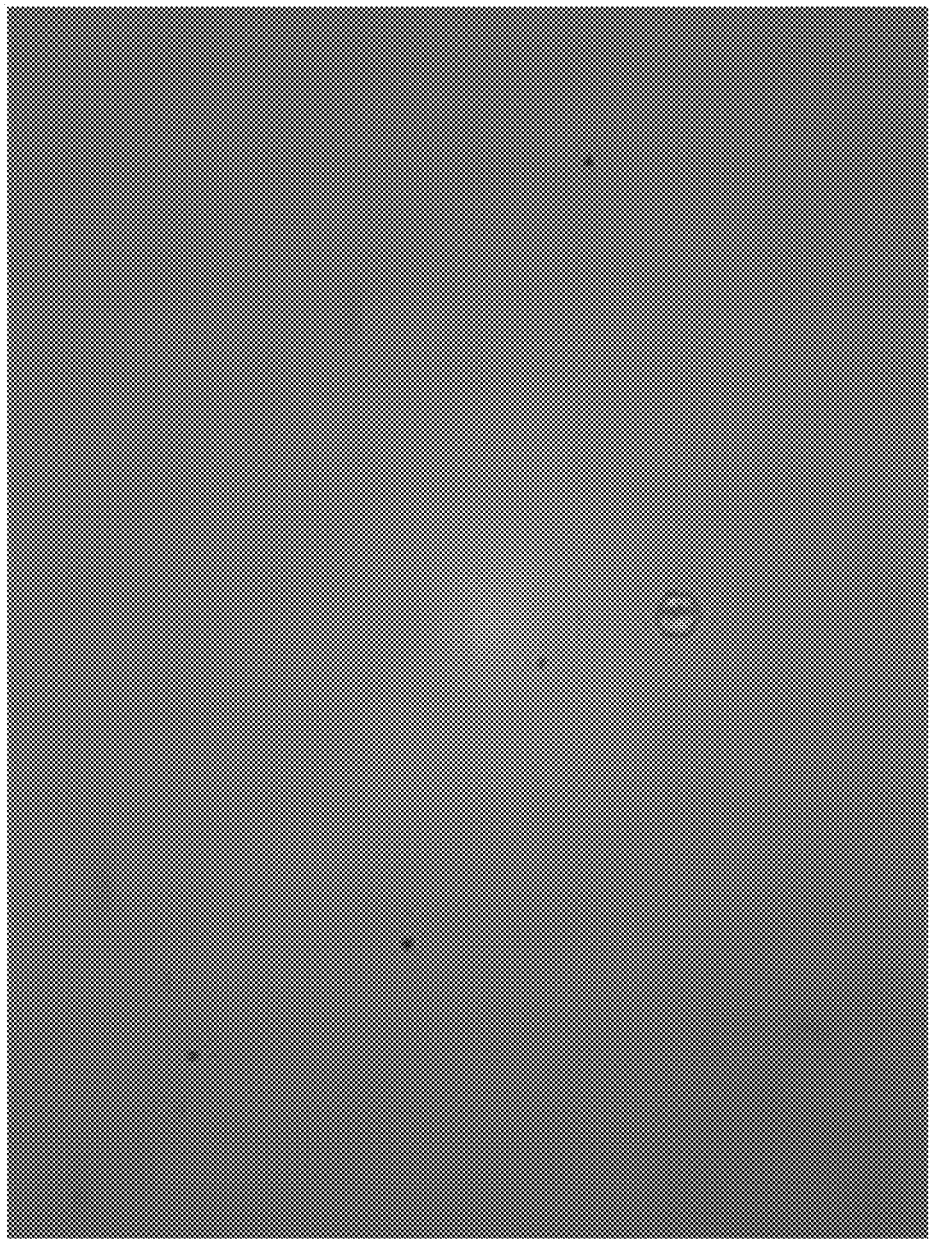
FIG. 3 shows an optical image of a hexagonal single-crystal (~30 μm in lateral dimension) grown on bare $SiO_2$ (200 nm)/Si substrate using CVD according to the present disclosure.

FIG. 2 shows the schematic diagram of the first CVD approach for synthesizing thin $SnS_2$ and SnS crystal grains (and continuous films) in an embodiment of the present disclosure. Solid tin and sulfur sources (e.g., in the powder form) were used and heated under inert gas flow (e.g. argon gas flow), with the Sn source heated at high temperatures between 200 to 1100° C. The Sn source was heated at approximately 690° C. in some embodiments, and the S source was heated at temperatures close to or above the melting point (about 115° C.). At high temperatures, the vapors of Sn and S are expected to be co-deposited on the target substrate (e.g., $SiO_2$/Si) nearby the solid sources and form thin $SnS_2$ crystal grains. By varying the processing time (from 1 sec to 80 min), the inert gas flow (from 0.05 to 2 L/min), the partial pressure (e.g., from $10^{-6}$ Torr to 2000 Torr), and the temperature (optimal range from 500 to 900° C.), CVD conditions for producing atomic-layer-thick $SnS_2$ crystal grains on insulating substrates such as $SiO_2$ (200 nm)/Si were achieved. A novel aspect of the scheme proposed in FIG. 2 lies in the use of an insulating substrate to seed the nucleation of $SnS_2$ layers, and the design of processing conditions to achieve atomic-layer by atomic-layer growth. The synthesis of hexagonal single-crystal grains of $SnS_2$ on bare $SiO_2$/Si substrates has been achieved in an embodiment of the present disclosure, as shown by the optical image of FIG. 3. For this sample of FIG. 3, the S and Sn sources were placed in a one-inch diameter quartz tube with the configuration illustrated in FIG. 2 and heated under an argon flow of 0.15 L/min to 209° C. and 690° C., respectively, in approximately 8 min. After that, the temperatures of the S and Sn sources were kept for 45 min, and then the system was cooled down to room temperature in a few hours. We note that for CVD growth on bare $SiO_2$/Si substrates as shown in FIG. 3, the yield of $SnS_2$ crystal grain is low and the position of the resultant crystal grain is random and uncontrollable.

the Creation of Arrays of Thin Crystal Grains of Layered Semiconductors at Predefined Locations on Suitable Substrates by Combining Defect or Catalytic Engineering with Standard Nanofabrication Technology and Chemical Vapor Deposition For integration in practical electronic devices, it is necessary to achieve wafer scale production of the above thin semiconductor crystal grains at predefined locations on suitable substrates. Embodiments of the present disclosure use nanofabrication processes to define defect or catalytic sites on suitable substrates (e.g., $SiO_2$/Si), which serve as the nucleation sites for the growth of thin semiconductor crystal grains in the CVD process described above, thereby achieving arrays of thin crystal grains of layered semiconductors at predefined locations on suitable substrates for practical applications.

Figure 4:
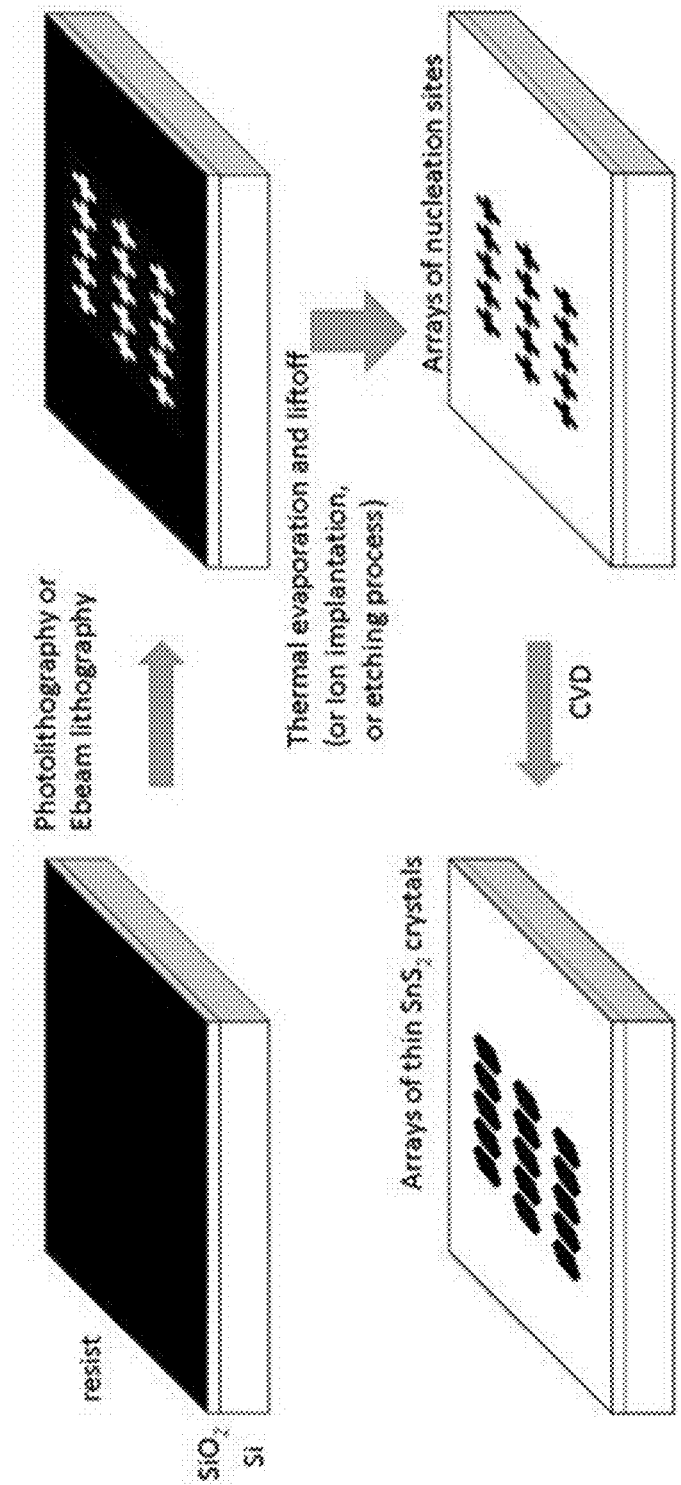
FIG. 4 shows schematic processing steps to create arrays of thin crystalline $SnS_2$ grains according to the present disclosure.

FIG. 4 illustrates the schemes for creating arrays of thin semiconductor crystal grains at predefined locations, in an embodiment of the present disclosure. First, arrays of defect or catalytic sites on substrates such as $SiO_2$/Si are designed by nanofabrication techniques such as photolithography, e-beam lithography, or using a stencil mask. The easiest way is to make arrays of thin "alignment marks" (in typical lateral dimensions from 10 nm to a few micron, or any size if needed) by optical lithography or e-beam lithography, combined with liftoff process or etching process. The alignment marks can be made of any materials including metals (e.g., Pd/Cr, Ni, Ti, or Cr) and insulators (e.g., $Al_2O_3$, $SiO_2$, $HfO_2$). They can also be made by ion implantation on the windows at the sites of alignment marks, or by etching away part of the $SiO_2$ materials at the alignment-mark sites via wet etching (e.g. buffered HF etching) or dry etching (e.g., reactive ion etching) the $SiO_2$/Si substrate. After that, CVD growth is performed on the substrate with alignment marks (i.e., engineered defect or catalytic sites), to produce arrays of thin semiconductor crystal grains at or near the locations of the predefined alignment marks, since the alignment mark should serve as the nucleation sites for the CVD growth of thin semiconductor crystal grains.

Figure 5:
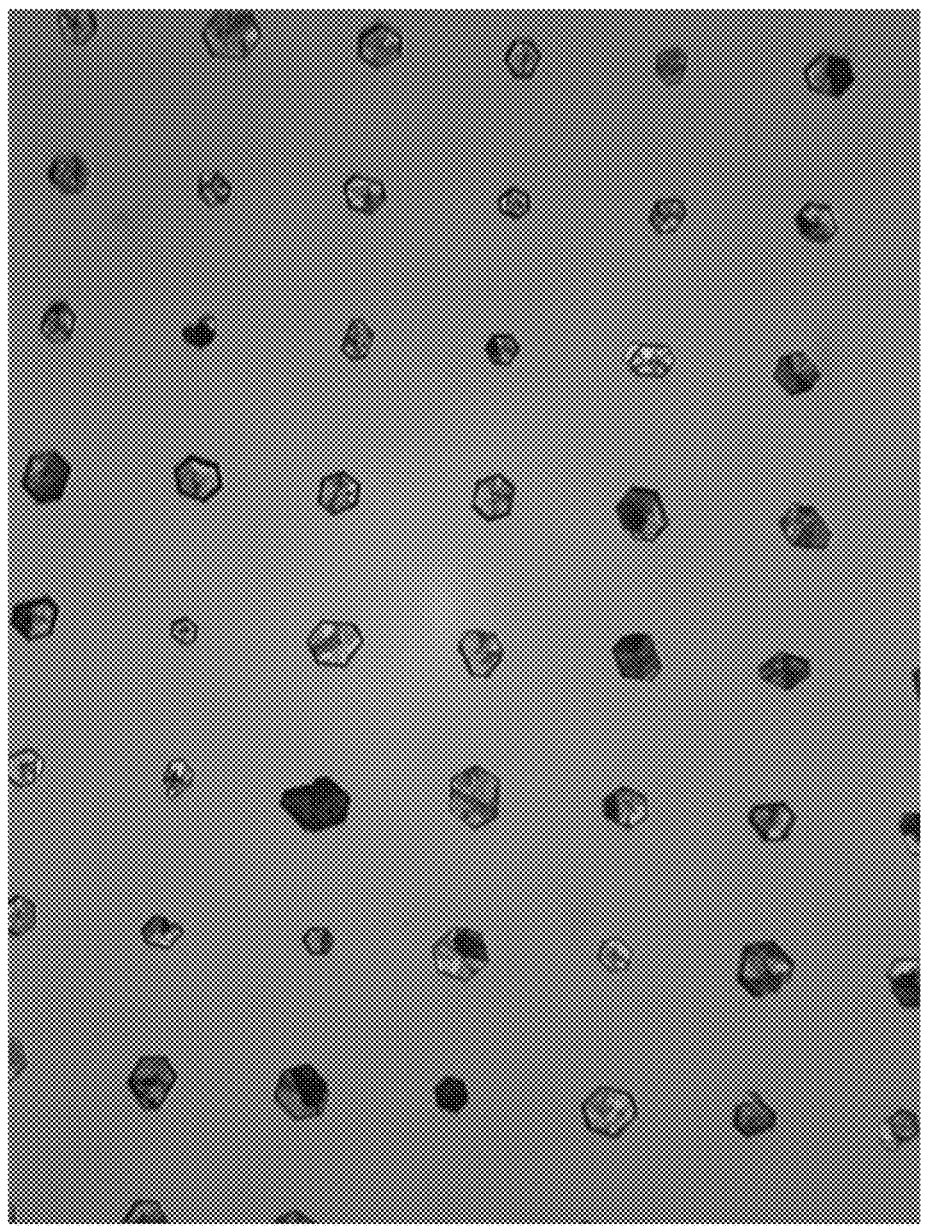
FIG. 5 shows an optical microscope image of chemical-vapor-deposited $SnS_2$ crystal arrays on $SiO_2$(200 nm)/Si substrate according to the present disclosure. Array spacing is ~100 μm.

Using the above strategy, arrays of hexagonal $SnS_2$ thin crystals on $SiO_2$/Si substrates were produced, as shown in FIG. 5. Raman scattering spectroscopy experiments confirmed that the hexagonal shape indicates single-crystal quality in some $SnS_2$ grains. In an embodiment of the present disclosure, a degenerately doped Si wafer coated with a top thermal oxide layer ~200 nm thick was used as a starting substrate (the top layer can also be a combination of silicon dioxide and other insulators such as silicon nitride or aluminum oxides, or the substrate can be any other insulating materials such as glass or quartz). After spin coating the wafer with photoresist (e.g., Shipley 1818), optical lithography (or e-beam lithography) was used to expose arrays of alignment marks (cross bars with a width ~3 μm). After that, with thermal evaporation and lift-off processes, arrays of alignment marks made of Pd thin film (e.g., 1 to 100 nm) on top of Cr thin film (e.g. 1-10 nm) were patterned on the $SiO_2$/Si substrate, which serve as the nucleation sites for the growth of $SnS_2$ crystal grains in the subsequent CVD process as described above. Solid tin and sulfur sources (e.g., in the powder form) were used, with the Sn source heated at high temperatures between 200 to 1100° C. (for example 690° C.) under inert gas flow (e.g. argon gas flow at 0.15 L/min), and the S sources heated at temperatures close to or above the melting point (115° C.). Maintained at the growth temperature for ~20 minutes, the vapors of Sn and S are co-deposited on the target substrate (e.g., $SiO_2$/Si) exactly near the predefined nucleation sites (alignment marks), and thus arrays of thin crystalline $SnS_2$ grains are achieved (FIG. 5). In the CVD process for producing the sample of FIG. 5, the S and Sn sources were placed in a one-inch diameter quartz tube with the configuration illustrated in FIG. 2 and heated under an argon flow of 0.15 L/min to 209° C. and 690° C., respectively, in approximately 8 min. After that, the temperatures of the S and Sn sources were kept for 20 min, and then the system was cooled down to room temperature in a few hours. Note that for CVD growth on such $SiO_2$/Si substrates with lithographically patterned Pd (70 nm)/Cr (5 nm) alignment marks, the yield of $SnS_2$ crystal grain is high and the resultant crystal grain are all grown at the predefined alignment mark positions. In one embodiment of the present disclosure, alignment marks made of Pd/Cr, Pd, Cr, or oxidized Cr can be used as the nucleation sites for CVD growth of semiconductor $SnS_2$ crystal grains.

In addition, by holding the sulfur source at lower temperatures of ~100° C., arrays of crystalline SnS grains can be produced. SnS is another semiconductor of importance in electronic or optical devices. For example, by following similar CVD procedure as used for producing the $SnS_2$ sample of FIG. 5 except for heating the sulfur source to lower temperature ~100° C., arrays of rhombic shape crystals were produced and identified to single crystal of SnS by Raman scattering spectroscopy.

Figure 6:
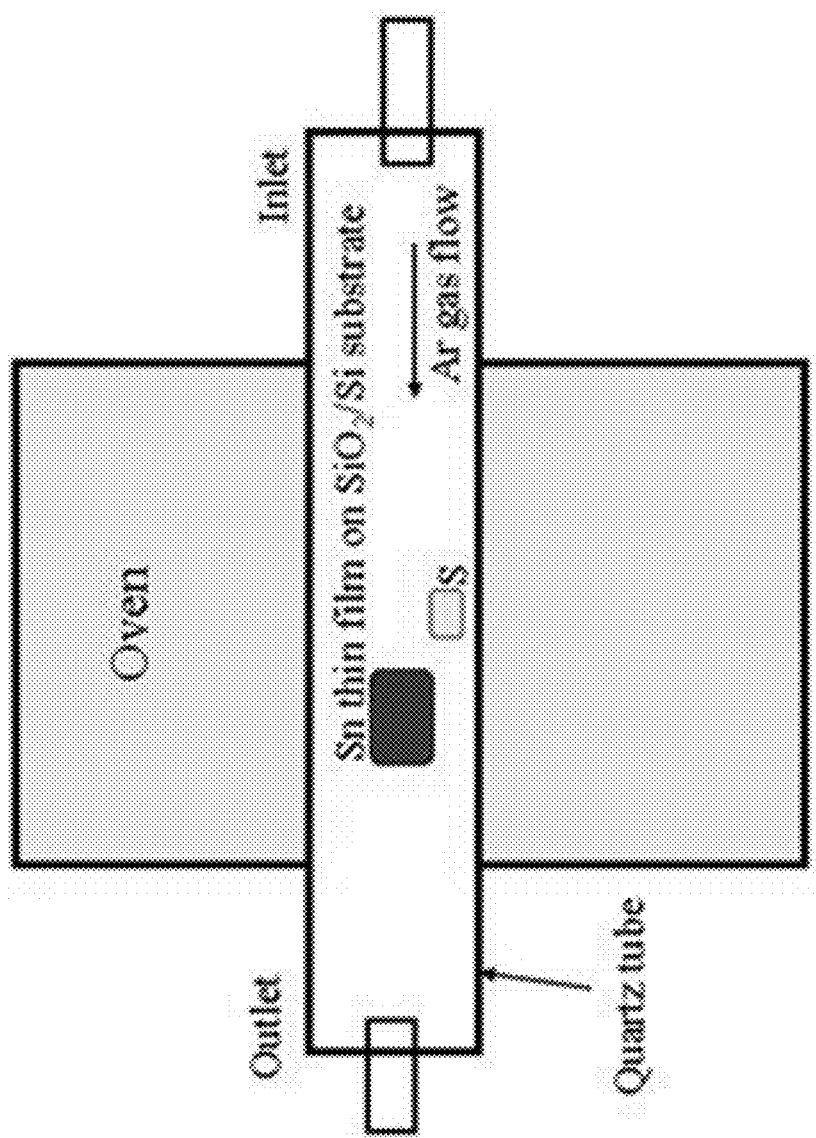
FIG. 6 shows a schematic diagram for a second CVD approach according to the present disclosure.

In an alternative embodiment of the present disclosure (shown in FIG. 6), thin films of Sn pre-patterned on insulating substrates can be used as the seed layers for synthesizing thin $SnS_2$ crystal grains or continuous films. Again at high temperatures the vaporization of solid sulfur source (placed nearby the substrates) will lead to the nucleation of $SnS_2$ crystal grains layer by layer on the substrate. In this scheme, the thin films of Sn (with a thickness in the order of nm or less) can be lithographically patterned on the substrates, and therefore allow the control of selective growth of $SnS_2$ crystal grains only on specific locations where Sn films are patterned. This CVD scheme is also convenient for the integration of $SnS_2$ and SnS thin crystals into nano-electronic systems via wafer-scale production. Additionally, to optimize the CVD process, the source of sulfur can be varied, e.g., by using gas-form sulfur sources mixed in the inert argon gas flow.

Figure 7:
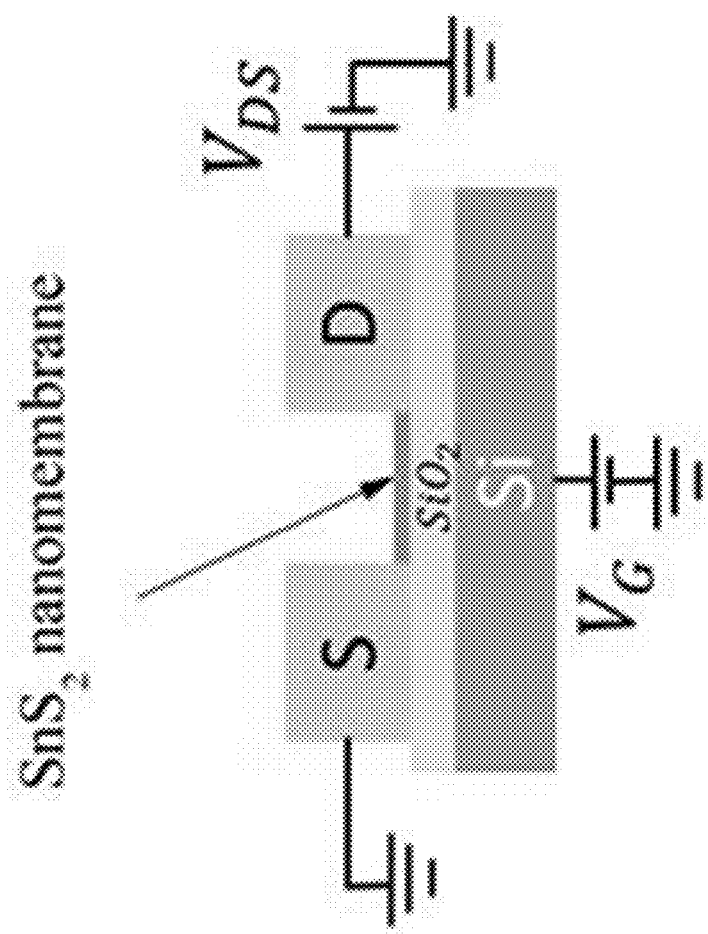
FIG. 7 shows a cross-sectional view of the field effect transistor design according to the present disclosure.

Fabrication of Arrays of Field Effect Transistors Based on Arrays of Thin Crystalline Semiconductor Grains In an embodiment of the present disclosure, field effect transistor (FET) arrays are fabricated, where each individual crystalline grain of layered semiconductor serves as the conduction channel for a FET, which can be used as the building blocks for applications in a wide range of areas including nano-electronic devices, memory devices, medical devices and energy storage. In the transistor design of FIG. 7, a crystalline semiconductor grain (e.g., SnS or $SnS_2$), CVD-grown on top of a $SiO_2$/Si substrate, serves as the conduction channel, and the degenerately doped Si is used as a back gate to tune the charge carrier densities. In addition, a top gate will be used for more practical applications by covering the thin semiconductor crystal grain with dielectric materials (e.g. $Al_2O_3$ or $HfO_2$) and subsequently patterning a metal gate on top of the gate dielectrics.

EXAMPLE 1

Methods for Producing Arrays of Thin Crystalline Grains of Layered Semiconductors at Predefined Locations on a Substrate Arrays of cross marks (FIG. 8a) were patterned on $SiO_2$/Si substrates as catalyst sites by photolithography, thermal evaporation and lift-off processes. Different materials of cross marks with a thickness from a few nm to 70 nm were explored, including Pd/Cr, Cr, $SiO_2$/Cr, Ni, $Al_2O_3$, and $SiO_2$. Typical lateral dimensions of cross marks were 15 μm×15 μm. CVD growth was carried out under ambient pressure in a 1" quartz tube furnace (FIG. 8b). Tin powder (Alfa Aesar, 99.85%) was placed in an alumina boat and loaded into the furnace center (uniform-temperature zone), and a $SiO_2$/Si substrate with pre-patterned cross-mark arrays was placed on top of the alumina boat. Another alumina boat with sulfur (Alfa Aesar, 99.5%) was placed upstream in a lower-temperature position (typically 17 cm and 19 cm away from the furnace center for the growth of $SnS_2$ and SnS, respectively), and the temperature at the sulfur position was calibrated using a Pt thermal couple as a function of furnace-center temperature. Before CVD growth, argon gas was used to flush the quartz tube at a rate of 2 L/min for 20 min. After that, the furnace was programmed with appropriate recipes to control the furnace-center temperature and argon flow at different stages. For growth of typical hexagonal $SnS_2$ crystal arrays such as that of FIG. 9a, the recipe is as follows: (1) the tin source (0.5 g) and the substrate were first heated from 25° C. to 705° C. in 10 min under an argon flow of 60 mL/min; (2) the argon flow was then stopped and the temperature was retained at 705° C. for 5 min before decreased to 580° C. in 30 min; and (3) the system was purged with an argon flow of 500 mL/min and cooled down naturally from 580° C. to room temperature in ~2 hr. The temperature of the sulfur source (1.15 g, placed 17 cm upstream from the center) was calibrated to be 213° C. when the tin source was at 705° C. For growth of typical orthorhombic SnS crystal arrays such as that of FIG. 10a, the recipe is as follows: (1) the tin source (5.69 g) and the substrate were first heated from 25° C. to 690° C. in 7 min under an argon flow of 150 mL/min; (2) the temperature was retained at 690° C. for 20 min with continued argon flow of 150 mL/min; and (3) the system was cooled down naturally from 690° C. to room temperature in ~2 hr. The temperature of the sulfur source (1.15 g, placed 19 cm upstream from the center) was calibrated to be 100° C. when the tin source was at 690° C.

Raman scattering experiments were performed using a T64000 Horiba JY Raman microscope equipped with Ar+ and HeNe lasers set to operate at 514 nm and 633 nm, respectively. A short-working distance objective with magnification 100× was used to focus the laser beam to a spot with diameter 1.2 μm (633 nm laser) or 0.7 μm (514 nm laser). The corresponding depth of focus of the objective was 1.1 μm (633 nm) or 0.4 μm (514 nm). Raman mapping involved a raster scan of the focused beam over a two-dimensional area on the sample at step size 0.5 μm. The Raman images were produced by de-convolution of Raman spectra recorded at each step into the spectra of constituent compounds coded with different colors. Brighter colors correspond to higher Raman intensities.

EXAMPLE 2

Figure 8:
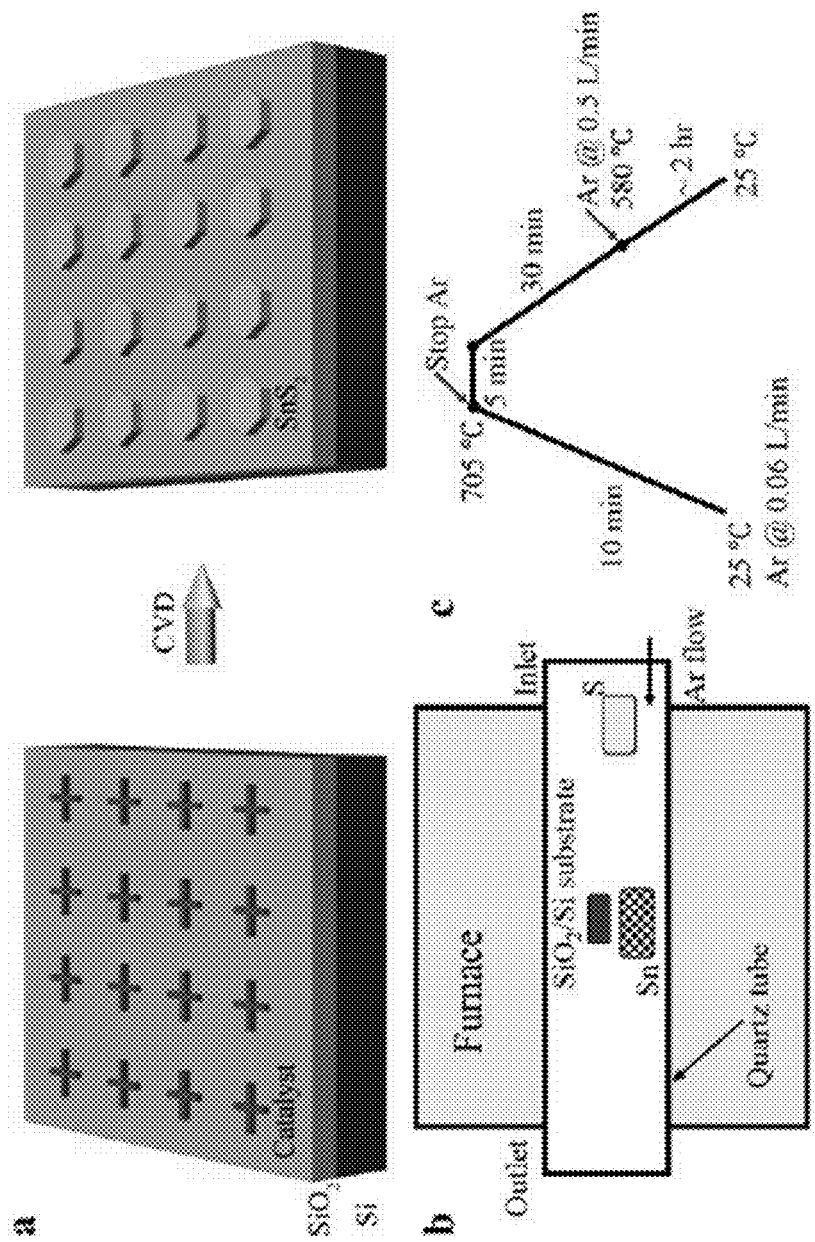

FIG. 8a illustrates an exemplary strategy for creating arrays of thin semiconductor crystal grains at predefined locations on substrates. First, arrays of catalyst sites on suitable substrates (e.g. $SiO_2/Si$) were designed by standard nanofabrication techniques. Here, the catalyst sites were cross marks made of thermally evaporated thin films such as Pd/Cr, Cr, $SiO_2$/Cr, and Ni (a few nm to tens of nm thick), which served as effective seeds for CVD growth of thin $SnS_2$ and SnS crystals. Second, a suitable CVD method was designed (FIGS. 8b and 8c) for the growth of $SnS_2$ (or SnS depending on growth conditions) crystals, where solid tin and sulfur sources are heated under argon gas flow to designed temperatures so that Sn and S vapors can react and thin crystal grains are nucleated exactly at the catalyst sites (cross marks) on substrates. By varying the CVD processing recipes, the amount of source materials and their temperatures, we have achieved the selective synthesis of either $SnS_2$ or SnS crystal arrays directly on insulating substrates $SiO_2/Si$. A unique feature of the scheme shown in FIG. 8 lies in the use of patterned catalyst sites to seed the nucleation of thin $SnS_2$ or SnS crystal arrays on chip. It was apparent that for CVD growth on bare $SiO_2/Si$ substrates without catalyst sites, the yield of $SnS_2$ or SnS crystals is low and their positions are random and uncontrollable.

EXAMPLE 3

Figure 9:
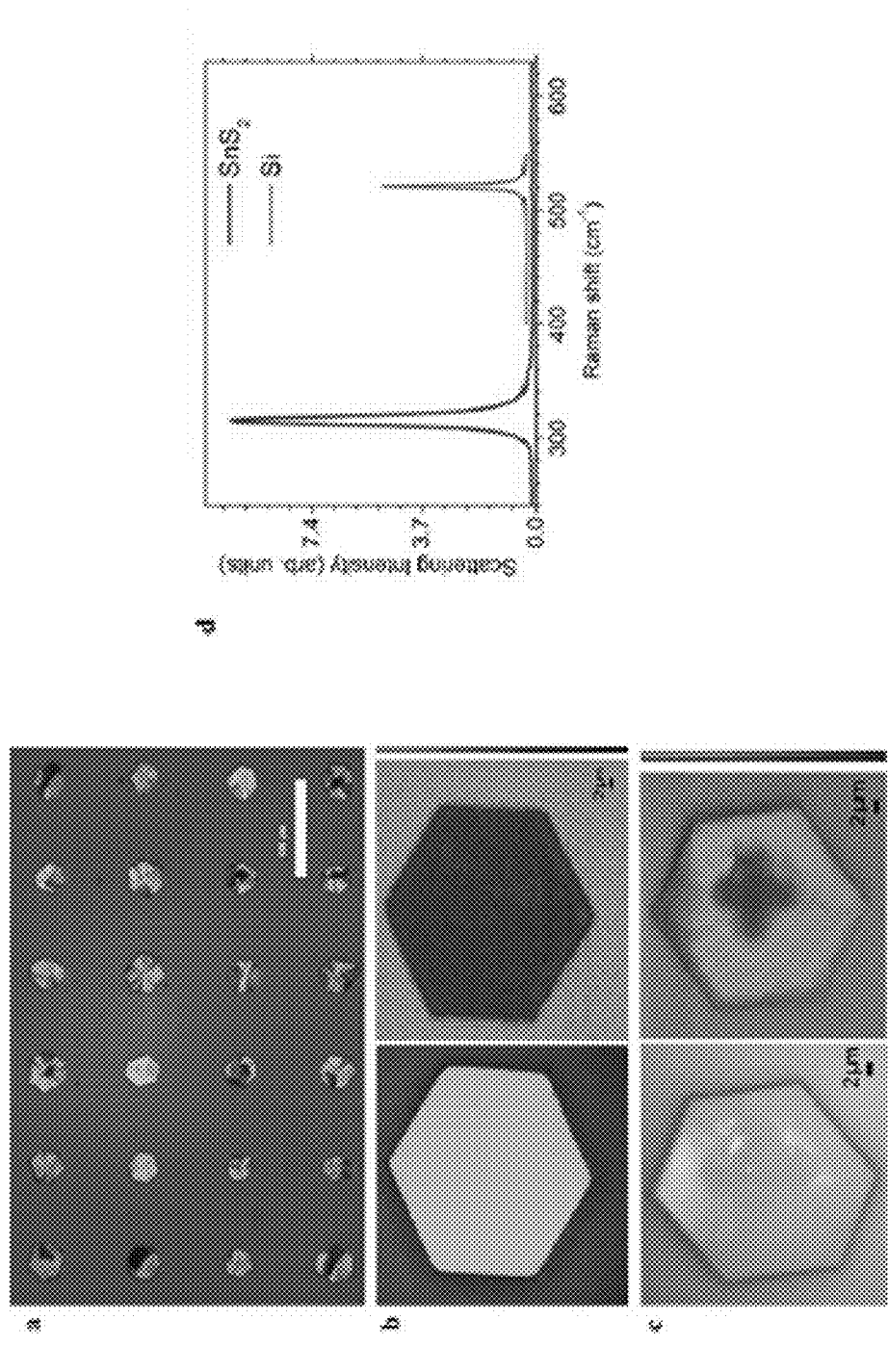
FIG. 9 shows hexagonal $SnS_2$ crystal arrays and Raman scattering characterization thereof, in an embodiment of the present disclosure. (a) An optical microscope image of $SnS_2$ crystal arrays on $SiO_2$ (300 nm)/Si substrate, produced by CVD using cross marks of Pd (2 nm)/Cr (1 nm) as the catalyst sites. Scale bar: 100 μm. (b) An optical image (Left) and Raman mapping (Right) with a 514 nm laser for a typical $SnS_2$ hexagonal crystal. Scale bar: 2 μm. (c) An optical image (Left) and Raman mapping (Right) with a 633 nm laser for another $SnS_2$ crystal. Scale bar: 2 μm. (d) Raman spectra of the $SnS_2$ crystal of (c) and the Si substrate.

FIG. 9a presents an optical microscope image of a typical hexagonal $SnS_2$ crystal array on $SiO_2/Si$, produced by CVD using lithographically patterned cross marks of Pd (2 nm thick)/Cr (1 nm thick) as catalyst sites. The hexagonal shape of the crystal grains reflects the natural crystal shape of bulk $SnS_2$.[12] The CVD method of the present disclosure leads to apparent seeded-growth of hexagonal crystals on the predefined sites with a yield of almost 100%, demonstrating the catalytic effect of patterned Pd/Cr as the nucleation sites. The lateral dimension of typical SnS2 hexagons is 20-50 μm, and their thickness is from 200 nm to a few microns. FIG. 9b shows the optical image of a hexagonal crystal and its Raman mapping of the A1g mode at 314 cm-1 for $SnS_2$,[36] excited with the 514 nm laser line. Since the laser energy (2.41 eV) is larger than the $SnS_2$ band gap (2.1 eV), light is mostly absorbed and scattered at the surface and the Raman image in FIG. 9b reveals the uniformity of the hexagonal crystal surface.

When a laser excitation with energy (1.96 eV, 633 nm line) less than the $SnS_2$ band gap (2.1 eV) is used, light can penetrate through $SnS_2$ crystals and reach the substrate. The catalyst site (cross mark) underneath a hexagonal crystal can be seen clearly in the Raman image (FIG. 9c), indicating that it indeed serves as the nucleation site for crystal growth. Corresponding Raman spectra (FIG. 9d) confirm that such hexagonal crystals are indeed $SnS_2$.[36]

EXAMPLE 4

To elucidate the growth mechanism for $SnS_2$ crystals, the CVD process was investigated in detail. For the sample of FIG. 9a, the recipe shown in FIG. 8c (see Example 1) was used, with the tin source material (weight: 0.50 g) placed at the furnace center and the sulfur source material (weight: 1.15 g) placed 17 cm upstream (FIG. 8a) from the center. The sulfur source temperature was calibrated as 213° C. when the furnace center was at 705° C. By performing control experiments (FIG. 12) with argon purging at different temperatures during the 30-min cooling step from 705° C. to 580° C., it was shown that the nucleation of $SnS_2$ crystals occurs mainly during cooling from 680° C. to 580° C.

Figure 12:
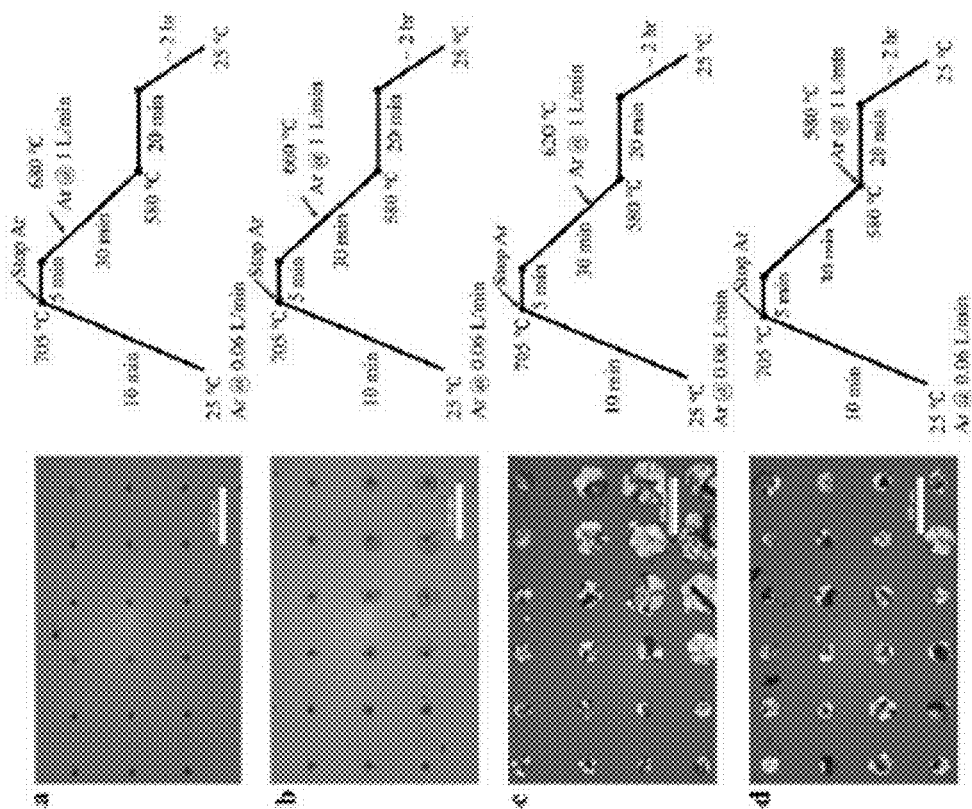
FIG. 12 shows optical images (left) of devices after seeded CVD growth with corresponding recipes (right) using cross marks of Pd (2 nm)/Cr (1 nm) on $SiO_2$ (300 nm)/Si substrates as the catalyst sites. As a control, the only change in these recipes is the temperature for argon purging during the cooling stage from 680° C. to 580° C.

FIG. 12 shows the effect of the cooling stage on the growth of hexagonal $SnS_2$ crystal grains. In FIG. 12, the results of control experiments of CVD growth with argon gas purging at different temperatures during the cooling stages from 705° C. to 580° C. are shown. In these control experiments, all other conditions were the same, except that the system was purged with argon gas flow of 1 L/min at different temperatures (marked by red arrow). A tin source of 0.50 g placed at the furnace center and a sulfur source of 1.15 g placed at 17 cm upstream away from the center were used. The results reveal that there is no crystal growth when the system is purged at a temperature of 680° C., indicating that the nucleation of crystals occurs mostly in the cooling stage from 680° C. to 580° C. When an argon purging (1000 mL/min) was used at a temperature of 660° C. during the cooling step, the resultant hexagonal crystals were much thinner. Thin $SnS_2$ crystals with a thickness down to 4 nm (~7 atomic layers) have been produced. With an argon purging at 680° C. during cooling, there is no growth of $SnS_2$ crystals on substrates. Without wishing to be bound by theory, this appears to point to a growth mechanism in which Sn—S gas phase is first formed at high temperatures, and then during the cooling from 680° C. to 580° C. such floating Sn—S gases are condensed on the catalyst sites and nucleated into hexagonal $SnS_2$ crystals. This mechanism would explain the absence of $SnS_2$ crystal growth with the argon purging above 680° C., since the floating Sn—S gases are diluted by the argon flow and thus the crystal nucleation on substrates is diminished.

Additional control experiments (FIG. 13) have revealed that the yield of $SnS_2$ crystal growth also depends on the cooling rate from 660° C. to 580° C. Therefore, the cooling stage from 680° C. to 580° C. without argon flow is critical for the nucleation of $SnS_2$ crystals on catalyst sites in the CVD process when a relatively small amount of tin source material ~0.50 g is used.

Figure 13:
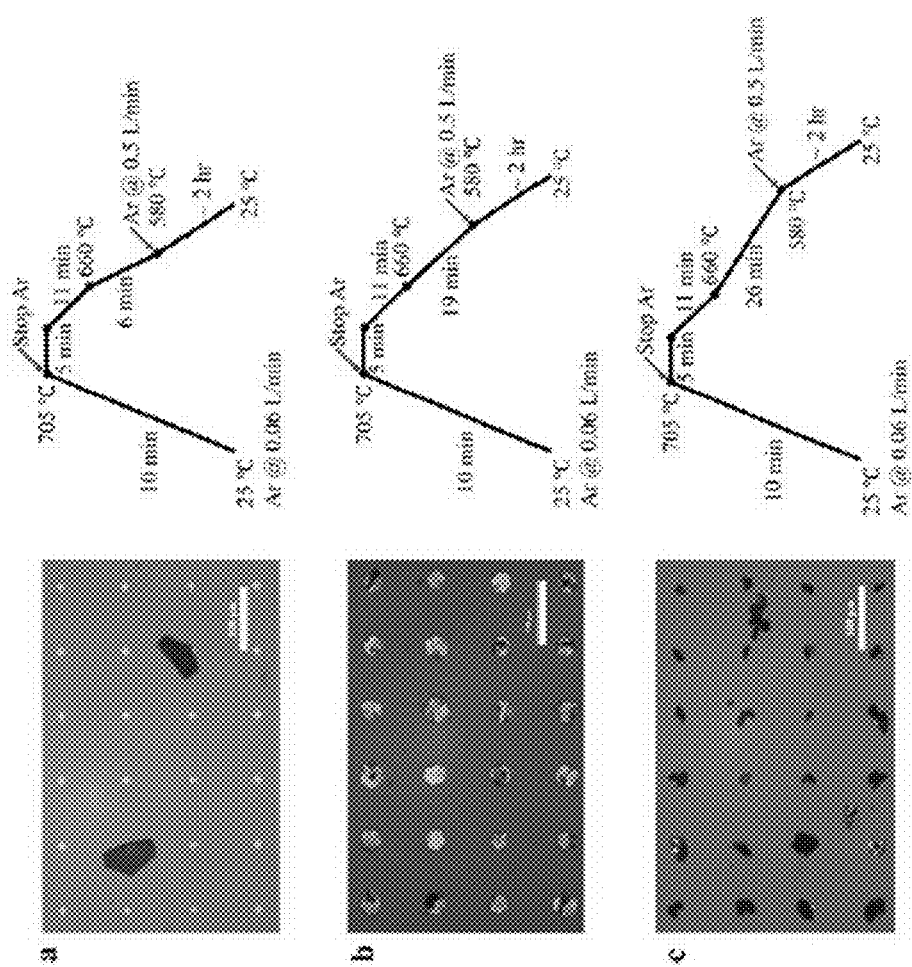
FIG. 13 shows optical images (left) of devices after seeded CVD growth with corresponding recipes (right) using cross marks of Pd (2 nm)/Cr (1 nm) on SiO2 (300 nm)/Si substrates as the catalyst sites. As a control, the only change in these recipes is the cooling rate from 660° C. to 580° C.

FIG. 13 shows the results of control experiments of CVD growth with different cooling rates during the crystal nucleation stages from 660° C. to 580° C. In those control experiments, all other conditions are the same, except that the cooling time from 660° C. to 580° C. was varied from 6 min to 26 min. A tin source of 0.50 g placed at the furnace center and a sulfur source of 1.15 g placed at 17 cm upstream away from the center were used. The results reveal that the yield of $SnS_2$ crystal growth depends on the cooling rate, and the crystal nucleation on catalyst sites is optimized with suitable cooling time between 6 to 26 min.

Figure 10:
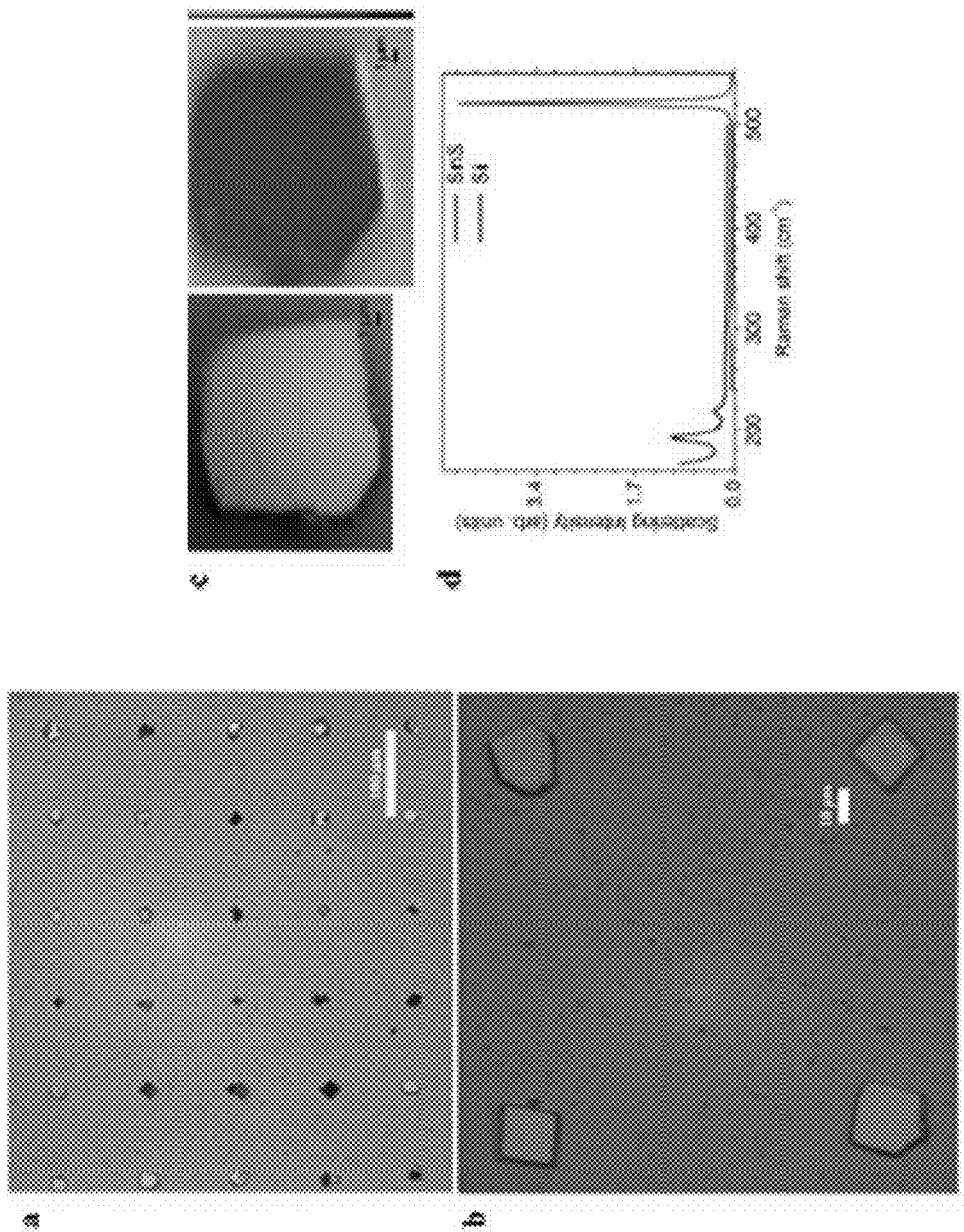
FIG. 10 shows orthorhombic SnS crystal arrays and Raman scattering characterization thereof in an embodiment of the present disclosure. (a) An optical microscope image of SnS crystal arrays on $SiO_2$ (200 nm)/Si substrate, produced by the CVD recipe described in main text. Scale bar: 100 μm. (b) A higher magnification image for the four crystals in the upper left corner of (a). Note that one crystal appears darker in (a) when imaged with lower magnification (likely due to different illumination condition). Scale bar: 10 μm. (c) An optical image (Left) and Raman mapping (Right) with a 633 nm laser for a SnS crystal (scale bar: 1 μm); and (d) the Raman spectra for this SnS crystal and the Si substrate.

Importantly, when the tin source material is increased significantly to ~5.7 g, either orthorhombic SnS crystal arrays or hexagonal $SnS_2$ crystal arrays can be selectively synthesized by modifying the sulfur source position (and thereby its temperature). FIGS. 10a and 10b show arrays of orthorhombic SnS crystals produced by using Pd/Cr as catalyst and a CVD recipe specified in Example 1. Here a tin source material (5.69 g) placed at the furnace center, and a sulfur source (1.15 g) placed at an upstream position (19 cm away from the center) were used, where the sulfur temperature was calibrated as 100° C. when the furnace center was at 690° C. The orthorhombic crystal shape reflects the natural crystal structure of SnS, and Raman scattering experiments (FIGS. 10c and 10d) further confirm that such orthorhombic crystals are indeed SnS with characteristic $A_g$ symmetry Raman modes at 192 cm$^{-1}$ and 218 cm$^{-1}$.[37] It is notable that the key to achieving orthorhombic SnS crystal arrays is the lower sulfur source temperature (100° C.) during the growth. Control experiments (FIG. 14) have shown that by moving the sulfur source to a higher-temperature position (209° C. when the furnace center was at 690° C.) while keeping all other conditions unchanged, hexagonal SnS$_2$ crystal arrays were produced instead of orthorhombic SnS crystal arrays. This may be because the melting point of sulfur is 115.2° C. and lowering its source temperature to 100° C. reduces the amount of sulfur vapors available for the crystal synthesis, thus leading to a SnS phase instead of SnS$_2$.

Figure 14:
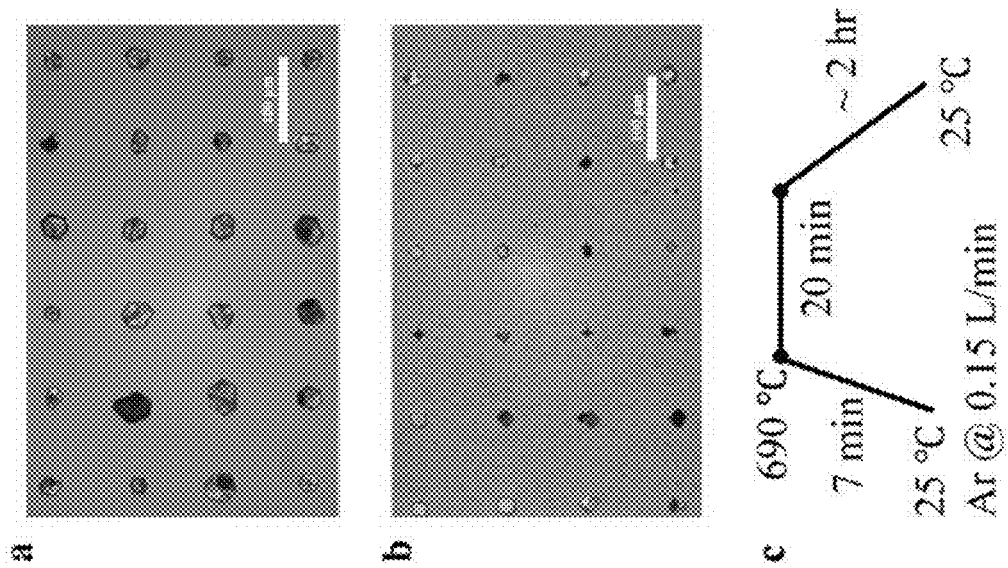
FIG. 14 shows optical images of devices with (a) hexagonal $SnS_2$ crystal arrays and (b) orthorhombic SnS crystal arrays, after seeded CVD growth with the same recipe shown in (c) using cross marks of Pd (70 nm)/Cr (5 nm) on $SiO_2$ (200 nm)/Si substrates as the catalyst sites. As a control, the only difference for these two CVD experiments is a sulfur source position at 17 cm away from the furnace center for (a) and 19 cm for (b), respectively.

FIG. 14 shows selective growth of hexagonal SnS$_2$ crystal arrays or orthorhombic SnS crystal arrays by varying the sulfur source temperature. FIG. 14 illustrates the effect of the sulfur source temperature on the selective growth of either hexagonal SnS$_2$ crystal arrays or orthorhombic SnS crystal arrays, when the tin source material is sufficient. Note that a tin source of 5.69 g was used in the growth of FIG. 14. In these two control experiments, all other conditions were the same, except that the sulfur source was positioned at 17 cm away from the furnace center for the growth of hexagonal SnS$_2$ crystal arrays (FIG. 14a) and at 19 cm away for orthorhombic SnS crystal arrays (FIG. 14b), respectively. When the temperature of the furnace center is 690° C., the sulfur source temperature is calibrated to be 209° C. and 100° C. for the processing of FIGS. 14a and 14b, respectively. This indicates that for sufficient tin source material in the CVD growth, holding the sulfur source slightly below its melting point leads to the growth of SnS crystal arrays, likely due to the reduced amount of sulfur vapor during the reaction stage.

Figure 11:
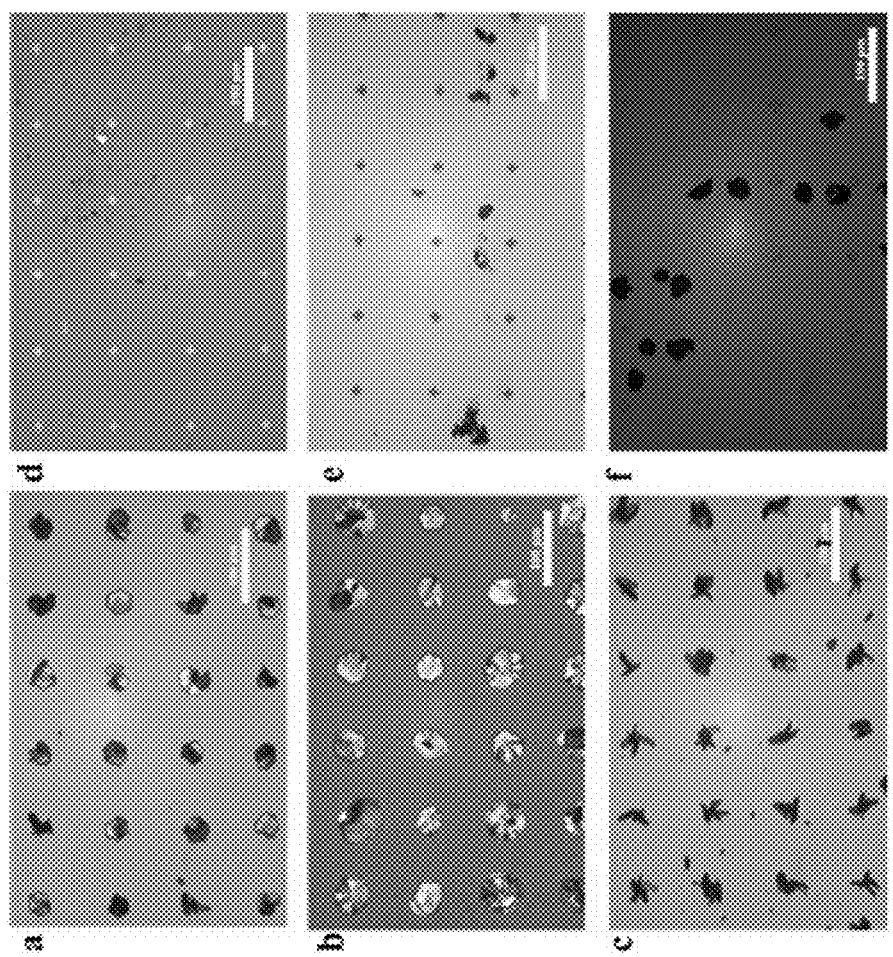
FIG. 11 shows the effect of different catalyst materials in embodiments of the present disclosure. Optical images of CVD growth results using cross marks (catalyst sites) of: (a) Cr (10 nm); (b) $SiO_2$ (5 nm)/Cr (2 nm); (c) Ni (2 nm); (d) Pd (2 nm); (e) $SiO_2$ (70 nm); and (f) $Al_2O_3$ (70 nm). The substrates are: $SiO_2$ (300 nm)/Si for (b) and (d), and $SiO_2$ (200 nm)/Si for the rest. Scale bars: 100 μm.

In principle, the nucleation of SnS$_2$ (SnS) crystals on predefined sites can be facilitated via two different mechanisms: (1) the aggregation of SnS$_2$ (SnS) molecules on a general defect site to form crystals; or (2) the chemical binding of SnS$_2$ (SnS) molecules to specific catalytic sites (e.g., Pd/Cr cross marks). The further experimental tests presented here by using different catalyst materials suggests that the chemical binding to specific catalytic materials is the key mechanism for the nucleation of SnS$_2$ crystals. As shown in FIGS. 11a-11c, the present disclosure illustrates that Cr, Ni, or Cr with a cap layer on top (e.g., Pd/Cr and SiO$_2$/Cr) serves as an effective catalyst. But Pd, SiO$_2$, and Al$_2$O$_3$ do not function as a catalyst to nucleate SnS$_2$ crystals (FIGS. 11e-11f). Interestingly, SiO$_2$ and Al$_2$O$_3$ tend to repel the nucleation of SnS$_2$ crystals since crystals are usually away from the cross marks (FIGS. 11e and 11f). However, it is important to note that SiO$_2$/Cr works well as a catalyst (FIG. 11b), promising future integrated electronic applications since SiO$_2$ is insulating.

In summary, the present disclosure comprises a unique CVD method for achieving thin crystal arrays of SnS$_2$ and SnS at predefined catalyst sites on a chip, with the crystal thickness from a few microns down to 4 nm (~7 atomic layers) as demonstrated already (and feasible for down to even single atomic layer). With a band gap of 2.1 eV, such SnS$_2$ crystal arrays promise integrated photonic/electronic applications including high-power transistors and photodetector arrays, while SnS (band gap: 1.1 eV) is an important candidate for future photovoltaic applications.[38] Moreover, a similar strategy can be applied to achieve seeded growth of a series of important layered 2D semiconductor crystal arrays (e.g., MoS$_2$ and WS$_2$), therefore opening a pathway for their large-scale production for practical applications.

REFERENCES CITED

The following references, to the extent that they provide exemplary procedural or other details supplementary to those set forth herein, are specifically incorporated herein by reference.

Non-Patent Literature

1. Novoselov, K. S., Geim, A. K., Morozov, S. V., Jiang, D., Zhang, Y., Dubonos, S. V., Grigorieva, I. V. & Firsov, A. A. Electric field effect in atomically thin carbon films. Science 306, 666 (2004).
2. Novoselov, K. S., Geim, A. K., Morozov, S. V., Jiang, D., Katsnelson, M. I., Grigorieva, I. V., Dubonos, S. V. & Firsov, A. A. Two-dimensional gas of massless Dirac fermions in graphene. Nature 438, 197 (2005).
3. Zhang, Y. B., Tan, Y. W., Stormer, H. L. & Kim, P. Experimental observation of the quantum Hall effect and Berry's phase in graphene. Nature 438, 201 (2005).
4. Du, X., Skachko, I., Duerr, F., Luican, A. & Andrei, E. Y. Fractional quantum Hall effect and insulating phase of Dirac electrons in graphene. Nature 462, 192 (2009).
5. Bolotin, K. I., Sikes, K. J., Jiang, Z., Klima, M., Fudenberg, G., Hone, J., Kim, P. & Stormer, H. L. Ultrahigh electron mobility in suspended graphene. Solid State Communications 146, 351 (2008).
6. Novoselov, K. S., Jiang, D., Schedin, F., Booth, T. J., Khotkevich, V. V., Morozov, S. V. & Geim, A. K. Two-dimensional atomic crystals. Proceedings of the National Academy of Sciences of the United States of America 102, 10451 (2005).
7. Coleman, J. N., Lotya, M., O'Neill, A., Bergin, S. D., King, P. J., Khan, U., Young, K., Gaucher, A., De, S., Smith, R. J., Shvets, I. V., Arora, S. K., Stanton, G., Kim, H.-Y., Lee, K., Kim, G. T., Duesberg, G. S., Hallam, T., Boland, J. J., Wang, J. J., Donegan, J. F., Grunlan, J. C., Moriarty, G., Shmeliov, A., Nicholls, R. J., Perkins, J. M., Grieveson, E. M., Theuwissen, K., McComb, D. W., Nellist, P. D. & Nicolosi, V. Two-Dimensional Nanosheets Produced by Liquid Exfoliation of Layered Materials. Science 331, 568 (2011).
8. Ayari, A., Cobas, E., Ogundadegbe, O. & Fuhrer, M. S. Realization and electrical characterization of ultrathin crystals of layered transition-metal dichalcogenides. Journal of Applied Physics 101, 014507 (2007).
9. Splendiani, A., Sun, L., Zhang, Y., Li, T., Kim, J., Chim, C.-Y., Galli, G. & Wang, F. Emerging Photoluminescence in Monolayer MoS2. Nano Letters 10, 1271 (2010).
10. Mak, K. F., Lee, C., Hone, J., Shan, J. & Heinz, T. F. Atomically Thin MoS2: A New Direct-Gap Semiconductor. Physical Review Letters 105, 136805 (2010).
11. Radisavljevic, B., Radenovic, A., Brivio, J., Giacometti, V. & Kis, A. Single-layer MoS2 transistors. Nature Nanotechnology 6, 147 (2011).
12. De, D., Manongdo, J., See, S., Zhang, V., Guloy, A. & Peng, H. B. High on/off ratio field effect transistors based on exfoliated crystalline SnS2 nano-membranes. Nanotechnology 24, 025202 (2013).
13. Diaz-Pinto, C., De, D., Hadjiev, V. G. & Peng, H. AB-Stacked Multilayer Graphene Synthesized via Chemical Vapor Deposition: A Characterization by Hot Carrier Transport. Acs Nano 6, 1142 (2012).

14. Peng, H. B., Chang, C. W., Aloni, S., Yuzvinsky, T. D. & Zettl, A. Ultrahigh frequency nanotube resonators. Physical Review Letters 97, 087203 (2006).
15. Peng, H. B., Ristroph, T. G., Schurmann, G. M., King, G. M., Yoon, J., Narayanamurti, V. & Golovchenko, J. A. Patterned growth of single-walled carbon nanotube arrays from a vapor-deposited Fe catalyst. Applied Physics Letters 83, 4238 (2003).
16. Peng, H. B., Hughes, M. E. & Golovchenko, J. A. Room-temperature single charge sensitivity in carbon nanotube field-effect transistors. Applied Physics Letters 89, 243502 (2006).
17. Peng, H. B. & Golovchenko, J. A. Coulomb blockade in suspended Si(3)N(4)-coated single-walled carbon nanotubes. Applied Physics Letters 84, 5428 (2004).
18. Peng, H. B., Chang, C. W., Aloni, S., Yuzvinsky, T. D. & Zettl, A. Microwave electromechanical resonator consisting of clamped carbon nanotubes in an abacus arrangement. Physical Review B 76, 035405 (2007).
19. Peng, H. B., Zhao, B. R., Xie, Z., Lin, Y., Zhu, B. Y., Hao, Z., Tao, H. J., Xu, B., Wang, C. Y., Chen, H. & Wu, F. Ordered surface structure in La1−xCaxMnO3 films. Physical Review Letters 82, 362 (1999).
20. Peng, H. B., Zhao, B. R., Xie, Z., Lin, Y., Zhu, B. Y., Hao, Z., Ni, Y. M., Tao, H. J., Dong, X. L. & Xu, B. Surface pattern and large low-field magnetoresistance in La0.5Ca0.5MnO3 films. Applied Physics Letters 74, 1606 (1999).
21. Peng, H. B., Zhang, X. X., Xie, Z., Tao, H. J., Xu, B., Liu, H. & Zhao, B. R. Exchange biasing and low-field magnetoresistance in La0.67Ca0.33MnO3/La0.5Ca0.5MnO3 bilayers. Physical Review B 61, 8955 (2000).
22. Diaz-Pinto, C., Lee, S., Hadjiev, V. G. & Peng, H. Probing phonon emission via hot carrier transport in suspended graphitic multilayers. Solid State Communications 151, 1645 (2011).
23. Diaz-Pinto, C., Wang, X., Lee, S., Hadjiev, V. G., De, D., Chu, W.-K. & Peng, H. Tunable magnetoresistance behavior in suspended graphitic multilayers through ion implantation. Physical Review B 83, 235410 (2011).
24. De, D., Diaz-Pinto, C., Wu, Z. & Peng, H. B. Negative differential conductance in nanoscale normal metal/superconductor/normal metal junctions featuring Fe1+yTe1−xSex. Philosophical Magazine 92, 3842 (2012).
25. Peng, H. B., De, D., Wu, Z. & Diaz-Pinto, C. Observation of multiple superconducting gaps in Fe1+yTe1−xSex via a nanoscale approach to point-contact spectroscopy. Journal of Physics-Condensed Matter 24, 455703 (2012).
26. Fivaz, R. & Mooser, E. Mobility of Charge Carriers in Semiconducting Layer Structures. Physical Review 163, 743 (1967).
27. Hase, I. & Nishihara, Y. Electronic band structure of ZrNCl and HfNCl. Physica B 281, 788 (2000).
28. Hase, I. & Nishihara, Y. Electronic structure of superconducting layered zirconium and hafnium nitride. Physical Review B 60, 1573 (1999).
29. Williams, R. H., Murray, R. B., Govan, D. W., Thomas, J. M. & Evans, E. L. Band-Structure and Photoemission Studies of Sns2 and Snse2 0.1. Experimental. Journal of Physics C-Solid State Physics 6, 3631 (1973).
30. Yoffe, A. D. Low-dimensional systems: quantum size effects and electronic properties of semiconductor microcrystallites (zero-dimensional systems) and some quasi-two-dimensional systems. Advances in Physics 51, 799 (2002).
31. Ravindran, P., Delin, A., Ahuja, R., Johansson, B., Auluck, S., Wills, J. M. & Eriksson, O. Optical properties of monoclinic SnI2 from relativistic first-principles theory. Physical Review B 56, 6851 (1997).
32. Fang, C. M., deGroot, R. A. & Haas, C. Bulk and surface electronic structure of 1T-TiS2 and 1T-TiSe2. Physical Review B 56, 4455 (1997).
33. Chen, C. H., Fabian, W., Brown, F. C., Woo, K. C., Davies, B., Delong, B. & Thompson, A. H. Angle-Resolved Photoemission-Studies of the Band-Structure of Tise2 and Tis2. Physical Review B 21, 615 (1980).
34. Seaverson, L. M. & Corbett, J. D. Synthesis and Characterization of Oxide Interstitial Derivatives of Zirconium Monochloride and Monobromide. Inorganic Chemistry 22, 3202 (1983).
35. Cunningham, G., Lotya, M., Cucinotta, C. S., Sanvito, S., Bergin, S. D., Menzel, R., Shaffer, M. S. P. & Coleman, J. N. Solvent Exfoliation of Transition Metal Dichalcogenides: Dispersibility of Exfoliated Nanosheets Varies Only Weakly between Compounds. Acs Nano 6, 3468 (2012).
36. Hadjiev, V. G., De, D., Peng, H. B., Manongdo, J. & Guloy, A. M. Phonon probe of local strains in SnSxSe2−x mixed crystals. *Physical Review B* 87, 104302 (2013).
37. Chandrasekhar, H. R., Humphreys, R. G., Zwick, U. & Cardona, M. IR and Raman-Spectra of 4-6 Compounds SnS and SnSe. *Physical Review B* 15, 2177 (1977).
38. Vidal, J., Lany, S., d'Avezac, M., Zunger, A., Zakutayev, A., Francis, J. & Tate, J. Band-structure, optical properties, and defect physics of the photovoltaic semiconductor SnS. *Applied Physics Letters* 100, 032104 (2012).
39. Butler, S. Z., Hollen, S. M., Cao, L. Y., Cui, Y., Gupta, J. A., Gutierrez, H. R., Heinz, T. F., Hong, S. S., Huang, J. X., Ismach, A. F., Johnston-Halperin, E., Kuno, M., Plashnitsa, V. V., Robinson, R. D., Ruoff, R. S., Salahuddin, S., Shan, J., Shi, L., Spencer, M. G., Terrones, M., Windl, W. & Goldberger, J. E. Progress, Challenges, and Opportunities in Two-Dimensional Materials Beyond Graphene. *Acs Nano* 7, 2898 (2013).
40. Wang, Q. H., Kalantar-Zadeh, K., Kis, A., Coleman, J. N. & Strano, M. S. Electronics and optoelectronics of two-dimensional transition metal dichalcogenides. *Nature Nanotechnology* 7, 699 (2012).
41. Nicolosi, V., Chhowalla, M., Kanatzidis, M. G., Strano, M. S. & Coleman, J. N. Liquid Exfoliation of Layered Materials. *Science* 340, 1420 (2013).
42. Xu, M. S., Liang, T., Shi, M. M. & Chen, H. Z. Graphene-Like Two-Dimensional Materials. *Chemical Reviews* 113, 3766 (2013).
43. Avouris, P., Chen, Z. H. & Perebeinos, V. Carbon-based electronics. *Nature Nanotechnology* 2, 605 (2007).
44. Li, X., Zhang, F. & Niu, Q. Unconventional Quantum Hall Effect and Tunable Spin Hall Effect in Dirac Materials: Application to an Isolated MoS2 Trilayer. *Physical Review Letters* 110, 066803 (2013).
45. Mak, K. F., He, K. L., Shan, J. & Heinz, T. F. Control of valley polarization in monolayer MoS2 by optical helicity. *Nature Nanotechnology* 7, 494 (2012).
46. Mitzi, D. B., Kosbar, L. L., Murray, C. E., Copel, M. & Afzali, A. High-mobility ultrathin semiconducting films prepared by spin coating. *Nature* 428, 299 (2004).
47. Shi, Y. M., Zhou, W., Lu, A. Y., Fang, W. J., Lee, Y. H., Hsu, A. L., Kim, S. M., Kim, K. K., Yang, H. Y., Li, L. J., Idrobo, J. C. & Kong, J. van der Waals Epitaxy of MoS2 Layers Using Graphene As Growth Templates. *Nano Letters* 12, 2784 (2012).

48. Lee, Y. H., Zhang, X. Q., Zhang, W. J., Chang, M. T., Lin, C. T., Chang, K. D., Yu, Y. C., Wang, J. T. W., Chang, C. S., Li, L. J. & Lin, T. W. Synthesis of Large-Area MoS2 Atomic Layers with Chemical Vapor Deposition. *Advanced Materials* 24, 2320 (2012).

49. Than, Y. J., Liu, Z., Najmaei, S., Ajayan, P. M. & Lou, J. Large-Area Vapor-Phase Growth and Characterization of MoS2 Atomic Layers on a SiO2 Substrate. *Small* 8, 966 (2012).

50. Liu, K. K., Zhang, W. J., Lee, Y. H., Lin, Y. C., Chang, M. T., Su, C., Chang, C. S., Li, H., Shi, Y. M., Zhang, H., Lai, C. S. & Li, L. J. Growth of Large-Area and Highly Crystalline MoS2 Thin Layers on Insulating Substrates. *Nano Letters* 12, 1538 (2012).

51. Balendhran, S., Ou, J. Z., Bhaskaran, M., Sriram, S., Ippolito, S., Vasic, Z., Kats, E., Bhargava, S., Zhuiykov, S. & Kalantar-zadeh, K. Atomically thin layers of MoS2 via a two step thermal evaporation-exfoliation method. *Nanoscale* 4, 461 (2012).

52. Wu, W., De, D., Chang, S. C., Wang, Y. N., Peng, H. B., Bao, J. M. & Pei, S. S. High mobility and high on/off ratio field-effect transistors based on chemical vapor deposited single-crystal MoS2 grains. *Applied Physics Letters* 102, 142106 (2013).

53. van der Zande, A. M., Huang, P. Y., Chenet, D. A., Berkelbach, T. C., You, Y. M., Lee, G. H., Heinz, T. F., Reichman, D. R., Muller, D. A. & Hone, J. C. Grains and grain boundaries in highly crystalline monolayer molybdenum disulphide. *Nature Materials* 12, 554 (2013).

54. Amani, M., Chin, M. L., Birdwell, A. G., O'Regan, T. P., Najmaei, S., Liu, Z., Ajayan, P. M., Lou, J. & Dubey, M. Electrical performance of monolayer MoS2 field-effect transistors prepared by chemical vapor deposition. *Applied Physics Letters* 102, 193107 (2013).

55. Wang, X. S., Feng, H. B., Wu, Y. M. & Jiao, L. Y. Controlled Synthesis of Highly Crystalline MoS2 Flakes by Chemical Vapor Deposition. *Journal of the American Chemical Society* 135, 5304 (2013).

56. Price, L. S., Parkin, I. P., Hardy, A. M. E., Clark, R. J. H., Hibbert, T. G. & Molloy, K. C. Atmospheric pressure chemical vapor deposition of tin sulfides (SnS, Sn2S3, and SnS2) on glass. *Chemistry of Materials* 11, 1792 (1999).

57. Wang, W., Leung, K. K., Fong, W. K., Wang, S. F., Hui, Y. Y., Lau, S. P., Chen, Z., Shi, L. J., Cao, C. B. & Surya, C. Molecular beam epitaxy growth of high quality p-doped SnS van der Waals epitaxy on a graphene buffer layer. *Journal of Applied Physics* 111, 093520 (2012).

The invention claimed is:

1. A method of producing a semiconductor crystal grain on a substrate, comprising the steps of:
    a) producing a defect or catalytic site on the substrate; and
    b) heating a first solid Sn material source and a second solid S material source in the presence of the substrate;
    wherein the first solid Sn material source and the second solid S material source are heated sufficiently to form a vapor; and
    wherein the vapors of the first solid Sn material source and the second solid S material source are deposited on the substrate at the defect or catalytic site to form a semiconductor crystal grain.

2. The method of claim 1, wherein the semiconductor crystal grain is formed at a location determined by the location of the defect or catalytic site.

3. The method of claim 1, wherein the defect or catalytic site is produced by photolithography; by e-beam lithography; by using a stencil mask; by using electron beam exposure; by using ion beam exposure; by etching; by creating an alignment mark made of Pd/Cr, Cr, Pd, Ni, Ti, or a combination thereof; or by creating an alignment mark made of an insulator; or by creating an alignment mark made of multi-layers of insulators and metals such as $SiO_2$ and $Al_2O_3$ on top of Cr, Ni, Ti or Pd.

4. The method of claim 3, wherein the insulator used to create an alignment mark is $SiO_2$, $Al_2O_3$, $HfO_2$, or a combination thereof.

5. The method of claim 1, wherein multiple defect or catalytic sites are produced on the substrate, and wherein the vapors of the first solid Sn material source and the second solid S material source are deposited on the substrate at the defect or catalytic sites to form an array of semiconductor crystal grains.

6. The method of claim 5, wherein the array of semiconductor crystal grains forms a continuous thin film.

7. The method of claim 1, wherein the semiconductor crystal grain is selected from the group consisting of: metal chalcogenides and metal halides.

8. The method of claim 1, wherein the semiconductor crystal grain is selected from the group consisting of: $SnS_2$, SnS, or a combination thereof.

9. The method of claim 1, wherein the first solid Sn material source is Sn or Sn-based compounds, and the Sn is heated to between about 200° C. and about 1100° C.

10. The method of claim 1, wherein the second solid S material source is S or a mixture of S and Se, and the S or the mixture of S and Se is heated to about 115° C. or higher to produce $SnS_2$ crystal grains or continuous films.

11. The method of claim 1, wherein the second solid S material source is S or a mixture of S and Se, and the S or the mixture of S and Se is heated to below about 115° C. to produce SnS crystal grains or continuous films.

12. The method of claim 1, wherein the first solid Sn material source is Sn or Sn-based compounds, and the second solid S material source is S, the compounds of S and Se, or a mixture of S and Se or their compounds.

13. The method of claim 1, wherein the substrate is $SiO_2$/Si.

14. A semiconductor device having a crystal grain produced by the method of claim 1, in device applications such as field-effect transistors, sensors, memory devices, optoelectronics devices (e.g. photo detectors), photovoltaic devices, and energy storages.

15. A semiconductor device having a crystal grain, produced by the method of claim 1.

16. The semiconductor device having the crystal grain of claim 15, wherein the semiconductor crystal grain has a hexagonal or rhombic shape.

17. A method of producing a semiconductor crystal grain on a substrate, comprising the steps of:
    a) producing a defect or catalytic site on the substrate using lithography; and
    b) heating a first solid Sn material source and a second solid S material source in the presence of the substrate to a temperature between 200° C. to 1100° C.;
    wherein the first solid Sn material source and the second solid S material source are heated sufficiently to form a vapor; and
    wherein the vapors of the first solid Sn material source and the second solid S material source are deposited on the substrate at the defect or catalytic site to form a semiconductor crystal grain.

18. A method of producing a semiconductor crystal grain on a substrate, comprising the steps of:
- a) producing a defect or catalytic site on the substrate;
- b) heating a first solid Sn material source in the presence of the substrate using an inert gas at a temperature between 200° C. to 700° C.; and
- c) heating a second solid S material source in the presence of the substrate using an inert gas at a temperature of approximately 100° C.;
- wherein the first solid Sn material source and the second solid S material source are heated sufficiently to form a vapor by the inert gas; and
- wherein the vapors of the first solid Sn material source and the second solid S material source are deposited on the substrate at the defect or catalytic site to form a semiconductor crystal grain.

19. The method of claim 17 wherein the heating is maintained for approximately 20 minutes.

20. The method of claim 18 wherein the heating is maintained for approximately 20 minutes.

* * * * *